United States Patent
Lius et al.

(10) Patent No.: US 12,495,654 B2
(45) Date of Patent: Dec. 9, 2025

(54) ELECTRONIC DEVICE

(71) Applicant: Innolux Corporation, Miaoli County (TW)

(72) Inventors: Chandra Lius, Miaoli County (TW); Kuan-Feng Lee, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 525 days.

(21) Appl. No.: 18/150,766

(22) Filed: Jan. 5, 2023

(65) Prior Publication Data

US 2023/0253538 A1 Aug. 10, 2023

(30) Foreign Application Priority Data

Feb. 9, 2022 (CN) .......................... 202210133339.3

(51) Int. Cl.
*H10H 20/857* (2025.01)
(52) U.S. Cl.
CPC ................................ *H10H 20/857* (2025.01)
(58) Field of Classification Search
None
See application file for complete search history.

(56) References Cited

U.S. PATENT DOCUMENTS

| 2018/0046298 A1* | 2/2018 | Weng .................... G02F 1/1368 |
| 2020/0395433 A1 | 12/2020 | Sung et al. |
| 2021/0225989 A1 | 7/2021 | Ryu et al. |
| 2023/0253538 A1* | 8/2023 | Lius ...................... H01L 25/167 |
| | | 257/99 |

FOREIGN PATENT DOCUMENTS

| CN | 1753166 A | * | 3/2006 | ........... H10D 86/411 |
| CN | 103928469 A | * | 7/2014 | |
| CN | 117995963 A | * | 5/2024 | ........... H10D 86/441 |
| DE | 102020129973 A1 | * | 6/2021 | ........... H10D 84/853 |
| EP | 3557630 A1 | * | 10/2019 | ............. G06F 3/044 |
| JP | 5227536 B2 | * | 7/2013 | |
| JP | 2017135416 A | * | 8/2017 | ........... G02F 1/1368 |

(Continued)

OTHER PUBLICATIONS

"Office Action of Taiwan Counterpart Application", issued on May 26, 2023, p. 1-p. 6.

*Primary Examiner* — Michael Lebentritt
(74) *Attorney, Agent, or Firm* — JCIPRNET

(57) ABSTRACT

The disclosure provides an electronic device including a substrate, a semiconductor, a first conductive layer, a second conductive layer, a first insulating layer, and a second insulating layer. The semiconductor is disposed on the substrate. The first conductive layer is disposed on the semiconductor. The second conductive layer is disposed on the first conductive layer. The first insulating layer is disposed between the first conductive layer and the second conductive layer. The second insulating layer is disposed between the first conductive layer and the semiconductor. The second conductive layer is electrically connected to the first conductive layer through a first via penetrating the first insulating layer and electrically connected to the semiconductor through a second via penetrating the first insulating layer and the second insulating layer. A width of the first via is less than a width of the second via.

11 Claims, 23 Drawing Sheets

(56) References Cited

FOREIGN PATENT DOCUMENTS

| JP | 2020145441 | A  | * | 9/2020  | ........... H10D 30/673 |
|----|------------|----|---|---------|-------------------------|
| JP | 6870130    | B2 | * | 5/2021  | ........... H10D 86/471 |
| JP | 6986831    | B2 | * | 12/2021 | ............. H10D 99/00 |
| KR | 20080029796 | A | * | 4/2008  | ....... G02F 1/136286   |
| TW | I517258    | B  | * | 1/2016  | ............. H10D 86/60 |
| TW | 201616327  |    |   | 5/2016  |                         |
| TW | 201807551  |    |   | 3/2018  |                         |
| WO | WO-2021103604 | A1 | * | 6/2021 | ........... G09G 3/3266 |
| WO | WO-2022001435 | A1 | * | 1/2022 | ........... G09G 3/3266 |

* cited by examiner

ELECTRONIC DEVICE

CROSS-REFERENCE TO RELATED APPLICATION

This application claims the priority benefit of China application serial no. 202210133339.3, filed on Feb. 9, 2022. The entirety of the above-mentioned patent application is hereby incorporated by reference herein and made a part of this specification.

BACKGROUND

Technical Field

The disclosure relates to an electronic device.

Description of Related Art

In order to realize different circuit connection relationships, an electronic device needs to electrically connect different conductive layers. Therefore, the connection planning between multiple conductive layers is also an important part in the design of the electronic device.

SUMMARY

The disclosure relates to an electronic device, which helps to establish a good electrical connection between one conductive layer and different conductive layers.

According to an embodiment of the disclosure, an electronic device includes a substrate, a semiconductor, a first conductive layer, a second conductive layer, a first insulating layer, and a second insulating layer. The semiconductor is disposed on the substrate. The first conductive layer is disposed on the semiconductor. The second conductive layer is disposed on the first conductive layer. The first insulating layer is disposed between the first conductive layer and the second conductive layer. The second insulating layer is disposed between the first conductive layer and the semiconductor. The second conductive layer is electrically connected to the first conductive layer through a first via penetrating the first insulating layer and electrically connected to the semiconductor through a second via penetrating the first insulating layer and the second insulating layer. A width of the first via is less than a width of the second via.

According to an embodiment of the disclosure, an electronic device includes a substrate, a first conductive layer, a second conductive layer, and an insulating layer. The first conductive layer is disposed on the substrate. The second conductive layer is disposed on the first conductive layer. The insulating layer is disposed between the first conductive layer and the second conductive layer and has a via. The second conductive layer is electrically connected to the first conductive layer through the via, and a width of the via satisfies the following equation:

$$0.82*X+1.63 \ \mu m \leq Y \leq 0.82*X+2.43 \ \mu m,$$

where Y is the width of the via in μm, X is a depth of the via in μm, and X is greater than or equal to 0 μm and less than or equal to 3 μm.

DESCRIPTION OF EMBODIMENTS

Figure 1:
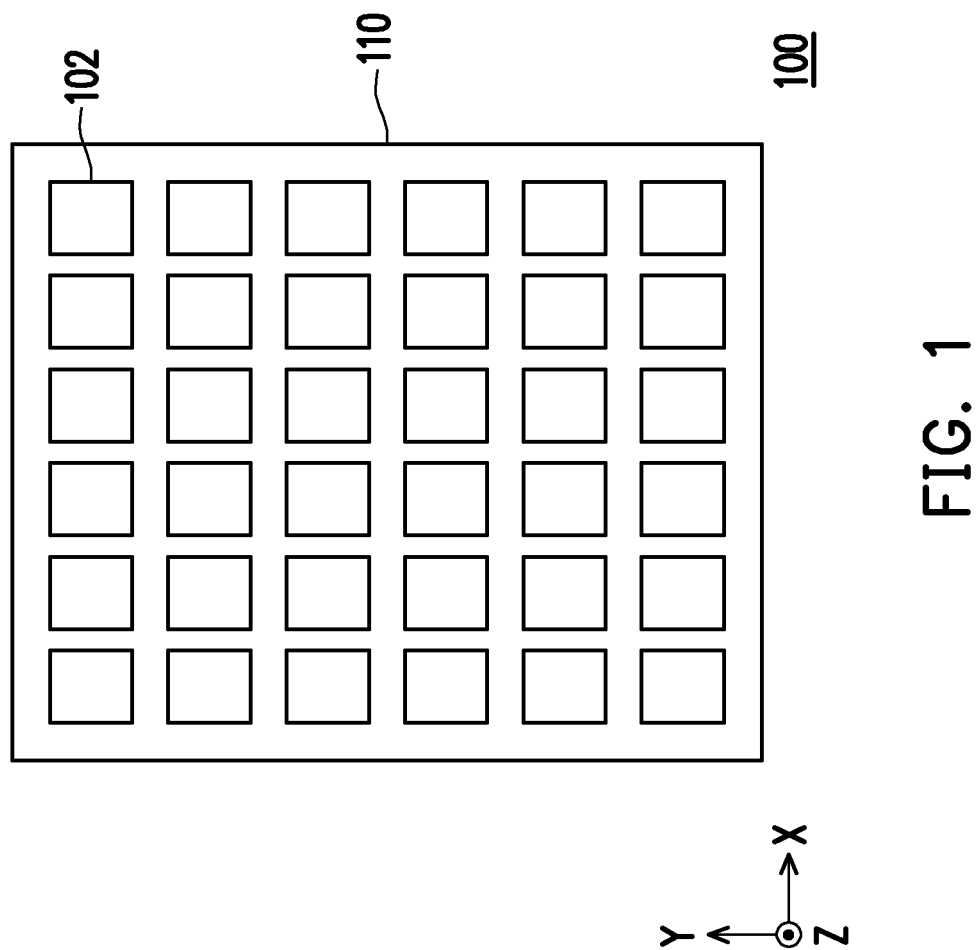
FIG. 1 is a schematic view of an electronic device according to an embodiment of the disclosure.

Reference will now be made in detail to the exemplary embodiments of the disclosure, examples of which are illustrated in the accompanying drawings. Wherever possible, the same reference numerals are used in the drawings and description to refer to the same or similar parts.

The disclosure can be understood with reference to the following detailed description in conjunction with the accompanying drawings. It should be noted that, for ease of understanding by readers and for the concision of the illustration, multiple drawings in the disclosure only depict a part of the electronic device, and certain elements in the drawings are not drawn according to actual scale. In addition, the number and size of each element in the drawings are for illustration only, and are not intended to limit the scope of the disclosure.

Certain terms may be used throughout the disclosure and the claims to refer to specific elements. Those skilled in the art will understand that electronic device manufacturers may refer to the same elements by different names. The disclosure does not intend to distinguish between elements that have the same function but have different names. In the following description and claims, the words "comprising," "including" and "having" are open-ended words, and thus should be interpreted as meaning "including but not limited to." Accordingly, when the words "comprising," "including" and/or "having" are used in the description of the disclosure, they designate the presence of the corresponding feature, region, step, operation and/or component, but do not exclude the existence of one or more corresponding features, regions, steps, operations and/or components.

Directional terms mentioned herein, such as "up," "down," "front," "rear," "left," "right," and the like refer only to the directions of the drawings. Accordingly, the directional terms used are for illustration, and are not intended to limit the disclosure. In the drawings, each figure illustrates the general characteristics of methods, structures and/or materials used in particular embodiments. However, these drawings should not be construed to define or limit the scope or nature covered by these embodiments. For example, the relative sizes, thicknesses and positions of various layers, regions and/or structures may be reduced or enlarged for clarity.

When a corresponding component (for example, a film or a region) is referred to as being "disposed or formed on" another component, it may be directly disposed or formed on another component, or other components may be present in between. In addition, when a component is referred to as being "directly disposed on or formed on" another component, there are no components in between. In addition, when a component is referred to as being "disposed or formed on" another component, the two components may be at different heights in a top view, and the component may be above or below another component, and their relative heights depends on the orientation of the device.

It will be understood that when a component or a layer is referred to as being "connected to" another component or layer, it may be directly connected to another component or layer, or there may be an intervening component or layer in between. When a component is referred to as being "directly connected" to another component or layer, there are no intervening components or layers in between. In addition, when a component is referred to as being "coupled to another component (or a variant thereof)" or "electrically connected to another component (or a variation thereof)," it may be directly connected to another component, or indirectly connected to another component through one or more components.

The terms "about," "equal to," "equivalent" or "same," "substantially" or "generally" are generally interpreted as within 20% of a given value or range, or as within 10%, 5%, 3%, 2%, 1%, or 0.5% of a given value or range.

Terms such as "first," "second" and the like used in the disclosure and the claims are used to modify elements and do not imply and represent that the element(s) have any preceding ordinal numbers, nor do they represent the order of a certain element and another element, or the order of the manufacturing method; the use of these ordinal numbers is only used to clearly distinguish an element with a certain name from another element with the same name. The claims and the disclosure may not use the same terms, whereby a first element in the disclosure may be a second element in the claims.

It should be noted that, in the following embodiments, features in several different embodiments may be replaced, recombined, and mixed to complete other embodiments without departing from the spirit of the disclosure. As long as the features of the various embodiments do not depart from the spirit of the invention or conflict with each other, they may be mixed and matched as desired. The direction X, the direction Y, and the direction Z are indicated in the drawings disclosed herein below to indicate the orientation of individual elements and devices. In some embodiments, the direction X, the direction Y, and the direction Z are perpendicular to each other, but the disclosure is not limited thereto. In some other embodiments, the directions X, Y, and Z may be three axial directions, any two of which intersect, but are not necessarily perpendicular to each other. In addition, terms such as first, second, third, and the like described below are only for the convenience of distinguishing multiple of the same or similar components, features and/or structures, and do not limit the manufacturing sequence or stacking order of these components, features and/or structures.

The electronic device of the disclosure may include a display device, an antenna device, a sensing device, a light emitting device, or a splicing device, but the disclosure is not limited thereto. The electronic device may include bendable or flexible electronic devices. The electronic device may include electronic components. The electronic device includes, for example, a liquid crystal layer or a light emitting diode (LED). The electronic components may include passive components and active components, such as capacitors, resistors, inductors, variable capacitors, filters, diodes, transistors, sensors, micro-electro-mechanical systems (MEMS), liquid crystal chips, and the like, but the disclosure is not limited thereto. The diodes may include light emitting diodes or photodiodes. The light emitting diodes may include, for example, organic light emitting diodes (OLEDs), mini LEDs, micro LEDs, quantum dot light emitting diodes (quantum dot LEDs), fluorescence, phosphor, or other suitable materials, or a combination of the above, but the disclosure is not limited thereto. The sensors may include, for example, capacitive sensors, optical sensors, electromagnetic sensors, fingerprint sensors (FPS), touch sensors, antenna, or pen sensors, and the like, but the disclosure is not limited thereto. Hereinafter, the disclosure will be described with the display device as the electronic device, but the disclosure is not limited thereto.

FIG. 1 is a schematic view of an electronic device according to an embodiment of the disclosure. The electronic device 100 includes multiple pixel circuits 102, and the pixel circuits 102 may be arranged on a substrate 110 in an array, but the disclosure is not limited thereto. The pixel circuit 102 may include, for example, a driving element and an electronic element, and the driving element is configured to drive the electronic element. In addition, the electronic device 100 may further include a signal line for transmitting signals and the like, and the signal line may be electrically connected to the driving element. However, in other embodiments, the pixel circuit 102 may further include other elements, and is not limited to the above elements. In some embodiments, the electronic components may be light emitting diodes and may emit light to provide lighting, display and other application fields. For example, the electronic device 100 may include a display panel, but is not limited thereto.

Figure 2:
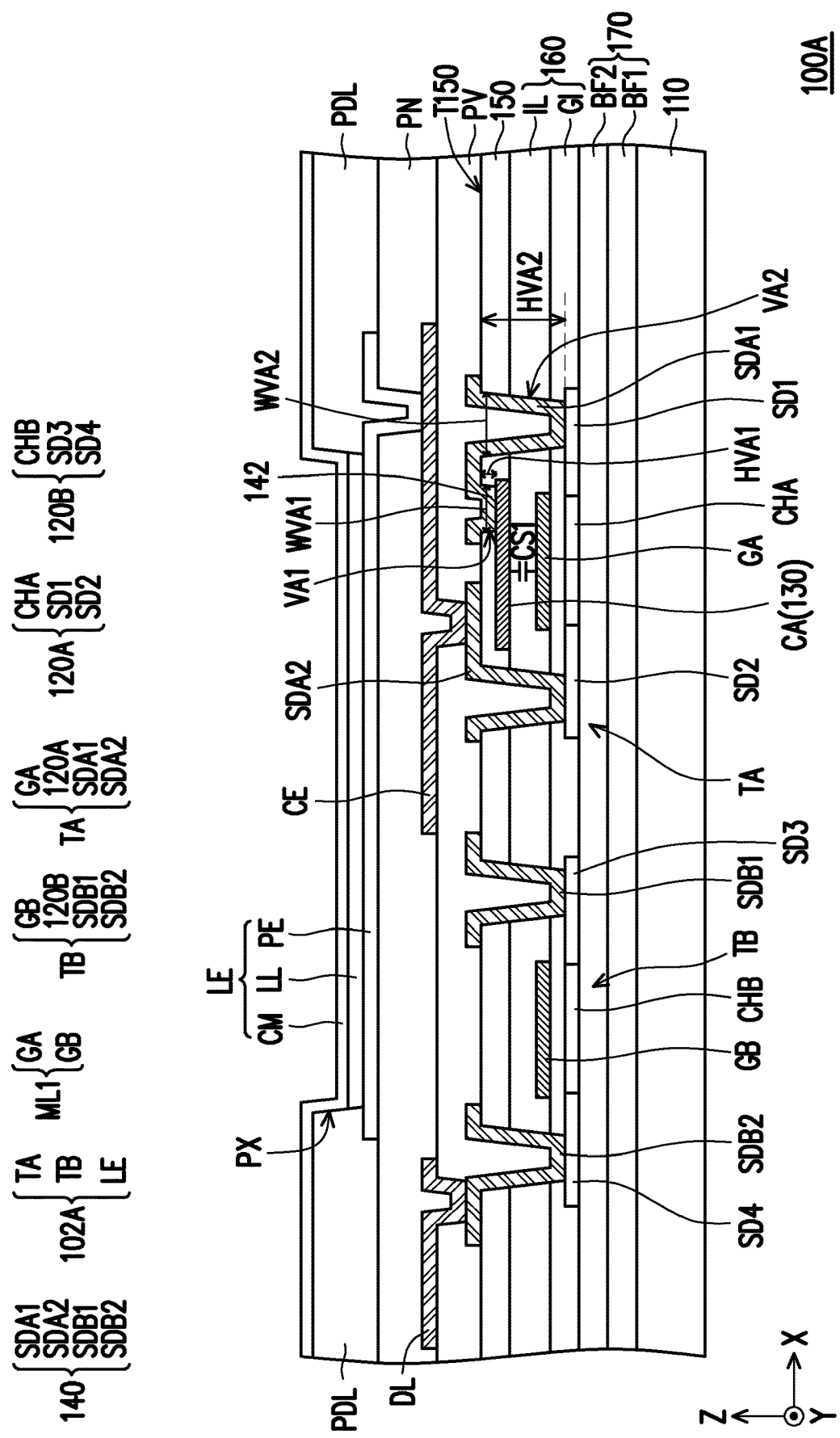
FIG. 2 is a schematic partial cross-sectional view of an electronic device according to an embodiment of the disclosure.

FIG. 2 is a schematic partial cross-sectional view of an electronic device according to an embodiment of the disclosure, and FIG. 2 may be understood as a partial view of one of the pixel circuits of FIG. 1. For example, FIG. 2 schematically shows a pixel circuit 102A. As shown in FIG. 2, an electronic device 100A includes at least a substrate 110 and a pixel circuit 102A, and the pixel circuit 102A includes at least a semiconductor 120A, a first conductive layer 130, a second conductive layer 140, a first insulating layer 150 and a second insulating layer 160. The semiconductor 120A is disposed on the substrate 110. The first conductive layer 130 is disposed on the semiconductor 120A. The second conductive layer 140 is disposed on the first conductive layer 130. The first insulating layer 150 is disposed between the first conductive layer 130 and the second conductive layer 140. The second insulating layer 160 is disposed between the first conductive layer 130 and the semiconductor 120A. In some embodiments, some elements in the pixel circuit 102A may configure driving elements, but the disclosure is not limited thereto.

In this embodiment, the second conductive layer 140 is farther away from the substrate 110 than the first conductive layer 130, and the first conductive layer 130 is farther away from the substrate 110 than the semiconductor 120A. In order to realize a required circuit, the second conductive layer 140 is electrically connected to the first conductive layer 130 and the semiconductor 120A. Specifically, the second conductive layer 140 is electrically connected to the first conductive layer 130 through a first via VA1. The first via VA1 penetrates the first insulating layer 150 and allows the second conductive layer 140 to be electrically connected to the first conductive layer 130 through the first via VA1. At the same time, the second conductive layer 140 is also electrically connected to the semiconductor 120A through a second via VA2. The second via VA2 penetrates the first insulating layer 150 and the second insulating layer 160 and allows the second conductive layer 140 to be electrically connected to the semiconductor 120A through the second via VA2. Here, a depth HVA1 of the first via VA1 is less than a depth HVA2 of the second via VA2. In addition, a width WVA1 of the first via VA1 is less than a width WVA2 of the second via VA2. For example, the vias that allow the same conductive layer to be electrically connected to different layers may have a structure in which the greater the depth is, the greater the width is, but the disclosure is not limited thereto. In this embodiment, the first insulating layer 150 is a single-layer structure, and the second insulating layer 160 is a multiple-layer structure, but the disclosure is not limited thereto. In some embodiments, each of the first insulating layer 150 or the second insulating layer 160 may include a single-layer structure, but may also include a multiple-layer structure, but the disclosure is not limited thereto.

The manufacturing method of the electronic device 100 includes forming the semiconductor 120A, the first conductive layer 130, the first insulating layer 150 and the second insulating layer 160 on the substrate 110 and then performing a patterning process to form the first via VA1 and the second via VA2. Next, the second conductive layer 140 is formed on the first insulating layer 150, and the second conductive layer 140 is electrically connected to the first conductive layer 130 and the semiconductor 120A through the first via VA1 and the second via VA2. In some embodiments, the first via VA1 and the second via VA2 may be formed by the same mask process. That is, the patterning process for forming the first via VA1 and the second via VA2 may be implemented by using the same lithography-etching process. That is, the first via VA1 and the second via VA2 may be manufactured at the same time.

For example, the patterning process of the via may include a lithography-etching step using a mask to define a photoresist pattern on the unpatterned first insulating layer 150, and then the photoresist pattern is used as a mask to etch the first insulating layer 150 to form the first via VA1 and to etch the first insulating layer 150 and the second insulating layer 160 to form the second via VA2. The process conditions of the etching step need to be such that the second insulating layer 160 and/or any insulating layer above the semiconductor 120A may be removed, so that the second via VA2 may expose the semiconductor 120A. Since the first via VA1 may be formed simply by etching the first insulating layer 150, the process time for forming the second via VA2 is longer than the process time for the first via VA1 to expose the first conductive layer 130. Therefore, when the second via VA2 is formed, the first via VA1 will undergo a longer process time and may be over-etched. For example, the size of the first via VA1 may be too large, which affects subsequent electrical connections. Therefore, in the embodiment, the mask used in the via forming process may be set to have a smaller pattern size corresponding to the first via VA1 and a larger pattern size corresponding to the second via VA2, which helps to prevent the size of the first via VA1 from affecting subsequent electrical connections due to over-etching. In some cases, the size of the first via VA1 may be too large and exposes other conductors, which causes an unexpected electrical connection to be established between the second conductive layer 140 and the other conductors. In addition, the excessive expansion of the first via VA1 may also cause the insulating layer under the first insulating layer 150 to be partially removed around the first via VA1 to form a groove. If such a groove is not filled by other materials in subsequent processes, it is likely to become structural defects, such as pores, which makes the electronic device 100A easy to be damaged, such as film peeling, material fragmentation, and the like.

In some embodiments, the width WVA1 of the first via VA1 may be less than the width WVA2 of the second via VA2. For example, the width WVA1 of the first via VA1 may satisfy the following equation: $0.82*X+1.63 \mu m \leq Y \leq 0.82*X+2.43 \mu m$, where Y is the width WVA1 of the first via VA1 in $\mu m$, X is a depth HVA1 of the first via VA1 in $\mu m$, and X is greater than or equal to 0 $\mu m$ and less than or equal to 3 $\mu m$. In some embodiments, the width WVA1 of the first via VA1 further satisfies the following equation: $0.82*X+1.83 \mu m \leq Y \leq 0.82*X+2.23 \mu m$, where Y is the width WVA1 of the first via VA1 in $\mu m$, X is the depth HVA1 of the first via VA1 in $\mu m$, and X is greater than or equal to 0 $\mu m$ and less than or equal to 3 $\mu m$.

In this embodiment, the electronic device 100A further includes layers of other insulating materials, such as a third insulating layer 170, a passivation layer PV, a planarization layer PN, and a pixel definition layer PDL, but the disclosure is not limited thereto.

In some embodiments, the third insulating layer 170 may include a multiple-layer structure, such as a buffer layer BF1 and a buffer layer BF2, but may also include only a single-layer structure (for example, a buffer layer BF1 or a buffer layer BF2), but the disclosure is not limited thereto. The third insulating layer 170 may be disposed between the pixel circuit 102A and the substrate 110, but the disclosure is not limited thereto. An active element TA includes a gate GA, the semiconductor 120A, a source-drain SDA1 and a source-drain SDA2. The semiconductor 120A includes a channel region CHA, a source-drain region SD1 and a source-drain region SD2. The source-drain region SD1 and the source-drain region SD2 are located on two opposite sides of the channel region CHA. The source-drain SDA1 and the source-drain SDA2 may be formed by the second conductive layer 140 and are electrically connected to the source-drain region SD1 and the source-drain region SD2 respectively. The second insulating layer 160 may include a gate insulating layer GI and an interlayer insulating layer IL. The gate GA is disposed above the channel region CHA, and the gate insulating layer GI is disposed between the gate GA and the semiconductor 120A. The gate GA may be configured by a conductive layer ML1 between the gate insulating layer GI and the interlayer insulating layer IL. The first conductive layer 130 defines a capacitor electrode CA at the active element TA. The interlayer insulating layer IL may cover the gate GA and be located between the gate GA and the capacitor electrode CA to form a capacitor structure CS1. In addition, the first insulating layer 150 is disposed between the first conductive layer 130 configuring the capacitor electrode CA and the second conductive layer 140 configuring the source-drain SDA1. In some embodiments, the second conductive layer 140 is configured to receive a power signal, and may provide the power signal to the source-drain region SD1 of the semiconductor 120A through the source-drain SDA1. In this embodiment, the second conductive layer 140 includes a connection part 142 and the source-drain SDA1 that are electrically connected to each other. The connection part 142 may extend from a top surface T150 of the first insulating layer 150 along the first via VA1 to be electrically connected to the capacitor electrode CA at the bottom of the first via VA1. The source-drain SDA1 may extend from the top surface T150 of the first insulating layer 150 along the second via VA2 and penetrate at least the first insulating layer 150 and the second insulating layer 160 to be electrically connected to the semiconductor 120A at the bottom of the second via VA2. In addition, the connection part 142 and the source-drain SDA1 are connected to each other on the top surface T150 of the first insulating layer 150.

The active element TB includes a gate GB, a semiconductor 120B, a source-drain SDB1 and a source-drain SDB2. The gate GB and the gate GA are the same layer, that is, the conductive layer ML1. The semiconductor 120A and the semiconductor 120B are the same layer. The semiconductor 120B includes a channel region CHB, a source-drain region SD3 and a source-drain region SD4. The source-drain region SD3 and the source-drain region SD4 are located on two opposite sides of the channel region CHB. The layers of the source-drain SDB1 and the source-drain SDB2 are the same as the layers of the source-drain SDA1 and the source-drain SDA2; that is, they are formed by the second conductive layer 140. Therefore, for the connection relationship and stacking relationship of the individual components in the active element TB, reference may be made to the active element TA. In some embodiments, the materials of the semiconductor 120A and the semiconductor 120B include silicon, such as amorphous silicon (a-Si) or polysilicon (p-Si), but the disclosure is not limited thereto. In some embodiments, the materials of the semiconductor 120A and the semiconductor 120B include metal oxides, such as indium gallium zinc oxide (IGZO), but the disclosure is not limited thereto. In addition, the materials of the first conductive layer 130, the second conductive layer 140 and the conductive layer ML1 include metals, metal alloys, and the like, and may be a single-layer conductive material layer or a stack of multiple conductive material layers, but the disclosure is not limited thereto.

The passivation layer PV covers the source-drain SDA1, the source-drain SDA2, the source-drain SDB1 and the source-drain SDB2, and the connection electrode CE is disposed on the passivation layer PV. The passivation layer PV may have a via that allows the connection electrode CE to be electrically connected to the source-drain SDA2 through the via. In addition, the electronic device 100A further includes a data line DL, which may be the same layer as the connection electrode CE. The passivation layer PV may have a via corresponding to the source-drain SDB2 that allow the data line DL to be electrically connected to the source-drain SDB2 through the corresponding vias. The planarization layer PN covers the connection electrode CE and the data line DL, and the light emitting element LE and the pixel definition layer PDL are disposed on the planarization layer PN. The pixel definition layer PDL may have a pixel opening PX that define a light emitting region. The light emitting element LE may include a pixel electrode PE, a light emitting layer LL and a common electrode CM; the light emitting layer LL is disposed between the pixel electrode PE and the common electrode CM, and is located in the pixel opening PX, but the disclosure is not limited thereto. In some embodiments, the light emitting layer LL is not only disposed in the pixel opening PX and may extend to the pixel definition layer PDL. The planarization layer PN may have a via that allows the pixel electrode PE to be electrically connected to the connection electrode CE through the via. The common electrode CM may be connected to a common potential, and the pixel electrode PE may be electrically connected to the active element TA through the connection electrode CE to receive a corresponding electrical signal. In addition, though not shown in the figures, the active element TA and the active element TB may be electrically connected to each other.

Figure 3:
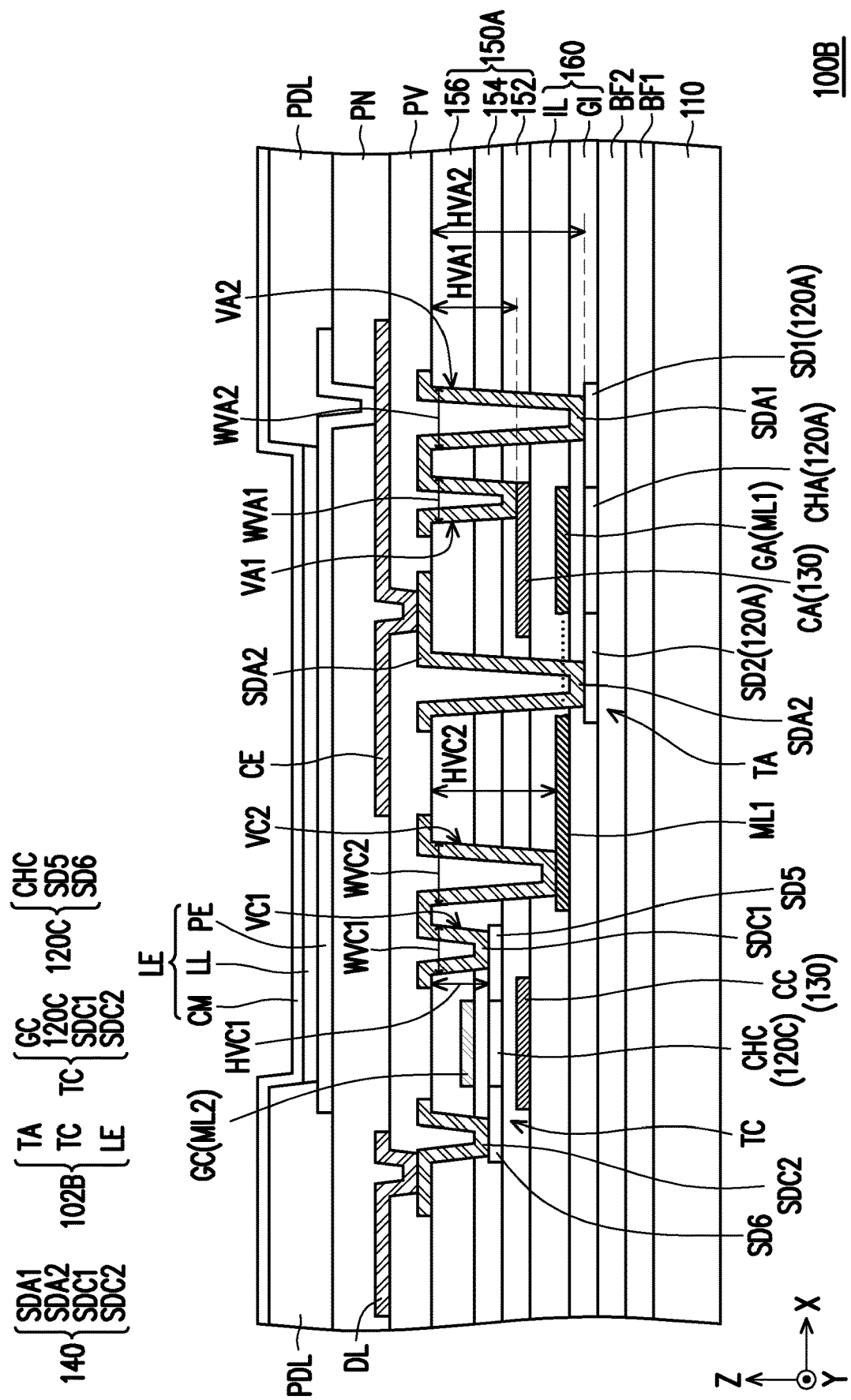
FIG. 3 is a schematic partial cross-sectional view of an electronic device according to an embodiment of the disclosure.

FIG. 3 is a schematic partial cross-sectional view of an electronic device according to an embodiment of the disclosure. FIG. 3, for example, shows an electronic device 100B including a pixel circuit 102B. In FIG. 3, the pixel circuit 102B includes an active element TA, an active element TC, and a light emitting element LE, and further includes a first insulating layer 150A, a second insulating layer 160, a third insulating layer 170, a passivation layer PV, a planarization layer PN, and a pixel definition layer PDL for separating different conductive layers. In addition, the electronic device 100B may further include the data line DL, the connection electrode CE, and the like as shown in FIG. 2.

Here, the active element TA, the light emitting element LE, the data line DL, the connection electrode CE, the second insulating layer 160, the third insulating layer 170, the passivation layer PV, the planarization layer PN, and the pixel definition layer PDL are substantially the same as those of the embodiment in FIG. 2. Therefore, the structures, configuration relationships, and the like of these components may be understood with reference to the related description in FIG. 2, and details are not repeated here.

In this embodiment, some of the layers in the active element TC may be different from the layers of the active element TA, and the first insulating layer 150A may include multiple sub-layers, such as an insulating sub-layer 152, an insulating sub-layer 154 and an insulating sub-layer 156. Specifically, the active element TC includes a semiconductor 120C, a gate GC, a source-drain SDC1 and a source-drain SDC2. The semiconductor 120C includes a channel region CHC, a source-drain region SD5 and a source-drain region SD6. The source-drain region SD5 and the source-drain region SD6 are located on two opposite sides of the channel region CHC. The semiconductor 120C is disposed between the insulating sub-layer 152 and the insulating sub-layer 154. The gate GC is disposed between the insulating sub-layer 154 and the insulating sub-layer 156 and is configured by another conductive layer ML2. The conductive layer ML2 is located between the insulating sub-layer 154 and the insulating sub-layer 156, and the insulating sub-layer 154 is located between the semiconductor 120C and the gate GC to serve as a gate insulating layer of the active element TC. The layers of the source-drain SDC1 and the source-drain SDC2 may be the same as the layers of the source-drain SDA1 and the source-drain SDA2. That is, the source-drain SDA1, the source-drain SDA2, the source-drain SDC1 and the source-drain SDC2 are all configured by the second conductive layer 140. In this way, the source-drain SDC1 and the source-drain SDC2 are disposed on the first insulating layer 150A, and are electrically connected to the semiconductor 120C through the corresponding vias.

In addition, the electronic device 100B further includes an electrode CC corresponding to the active element TC. The electrode CC may be configured by using the conductive layer ML1 and the first conductive layer 130. The electrode CC is disposed between the first insulating layer 150A and the second insulating layer 160, and the electrode CC and the gate GC are located on two opposite sides of the semiconductor 120C. In one embodiment, the electrode CC may serve as the gate of the active element TC, so that the active element TC is an active element of a double gate. In this embodiment, specifically, the source-drain SDC1 and the source-drain SDC2 are disposed on the insulating sub-layer 156. In some embodiments, the semiconductor 120A and the semiconductor 120C may use semiconductors of different materials. For example, one of the semiconductor 120A and the semiconductor 120C includes silicon, and the other includes metal oxide, but the disclosure is not limited thereto.

In addition, in this embodiment, the conductive layer ML1 configuring the gate GA of the active element TA may extend outward and be larger than the semiconductor 120A, and the source-drain SDC1 of the active element TC may be electrically connected first to the conductive layer ML1 and then the gate GA. In FIG. 3, the gate GA and the conductive layer ML1 located on two sides of the source-drain SDA2 are electrically connected to each other, and are substantially configured by the same conductor pattern. Therefore, the dotted line in FIG. 3 indicates that the relationship that two parts are electrically connected to each other. The dotted lines between the two conductive patterns in the following figures are also used to indicate the relationship of electrical connection with each other. Specifically, the source-drain SDC1 may be electrically connected to the semiconductor 120C through a first via VC1 and electrically connected to the conductive layer ML1 and then to the gate GA through a second via VC2. The first via VC1 may extend to the semiconductor 120C through the insulating sub-layer 156 and the insulating sub-layer 154 of the first insulating layer 150A, and the second via VC2 may extend to the conductive layer ML1 through the entirety of the first insulating layer 150A and the interlayer insulating layer IL of the second insulating layer 160. A depth HVC1 of the first via VC1 may be less than a depth HVC2 of the second via VC2. In some embodiments, a width WVC1 of the first via VC1 may be less than a width WVC2 of the second via VC2.

In this embodiment, the source-drain SDA1, the source-drain SDA2, the source-drain SDC1 and the source-drain SDC2 may extend to different depths from the first insulating layer 150A toward the substrate 110 through corresponding vias to contact and/or electrically connect components of different layers. For example, the second conductive layer 140 is electrically connected to the capacitor electrode CA of the first conductive layer 130 and the source-drain region SD1 of the semiconductor 120A through the first via VA1 and the second via VA2, and the second conductive layer 140 is electrically connected to the source-drain region SD5 of the semiconductor 120C and the conductive layer ML1 through the first via VC1 and the second via VC2. The first via VA1, the second via VA2, the first via VC1 and the second via VC2 have different depths. In some embodiments, the vias may be formed using the same mask, and deeper vias may be formed using a mask pattern with a larger size. Therefore, in some embodiments, the depths of the vias in order from smallest to greatest are the first via VC1, the first via VA1, the second via VC2 and the second via VA2, and the widths of the vias in order from smallest to greatest are the first via VC1, the first via VA1, the second via VC2 and the second via VA2. In other words, vias with smaller depths may have smaller widths.

Figure 4A:
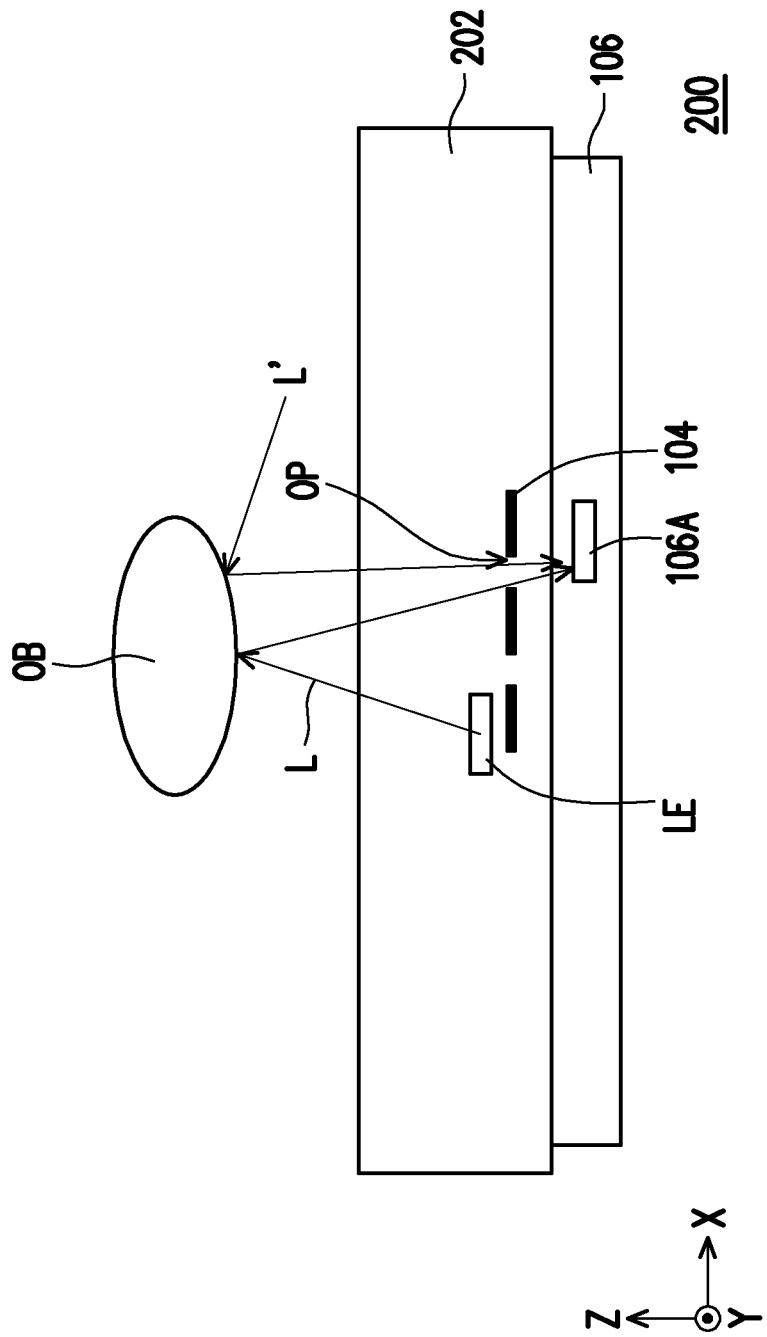
FIG. 4A is a schematic view of an electronic device according to an embodiment of the disclosure.

FIG. 4A is a schematic view of an electronic device according to an embodiment of the disclosure. An electronic device 200 of FIG. 4A includes a display device 202 and a sensor 106, wherein the display device 202 may include the pixel circuit (not shown) and the third conductive layer 104 as shown in FIG. 1. For the convenience of description, FIG. 4A schematically shows the light emitting element LE of the pixel circuit and omits other parts (for example, driving elements) of the pixel circuit. In addition, the sensor 106 may include a sensing unit 106A; only one light emitting element LE and one sensing unit 106A are shown in FIG. 4A for convenience of description, but the number of these components may be multiple as required. In addition, in this embodiment, the third conductive layer 104 is located between the light emitting element LE and the sensor 106, and the pixel circuit related to the light emitting element LE may be implemented in the manner of the foregoing embodiments, but the disclosure is not limited thereto. The light emitting element LE may be configured to emit light L, for example.

In this embodiment, the third conductive layer 104 may have an opening OP. Taking FIG. 4A as an example, a light L may be emitted toward an object OB located outside the electronic device 200. The object OB may reflect the light L which may travel towards the sensor 106. Alternatively, the object OB may reflect a light L' such as an ambient light to travel toward the sensor 106. At this time, the opening OP may allow the light L or the light L' to pass through and be received by the sensor 106. In some embodiments, the sensor 106 may receive the light L or the light L' and perform corresponding functions. For example, the sensor 106 may create an image corresponding to the object OB after receiving the light L or the light L' to serve as an image acquisition device, such as a camera, but the disclosure is not limited thereto. In addition, the sensor 106 may recognize the object OB after receiving the light L or the light L' to serve as an optical identification device, such as a fingerprint device, but the disclosure is not limited thereto. Therefore, the electronic device 200 may have an image display function and a function of image acquisition and/or recognition of the object OB. For example, the electronic device 200 may be a display device with a fingerprint recognition function and/or a display device with an under-screen camera, but the disclosure is not limited thereto. The opening OP of the third conductive layer 104 may be disposed correspondingly to the sensor 106 and may be adjusted according to the disposition density of the sensing units 106A and the required light reception effect. For example, a larger or greater number of openings OP may allow the sensor 106 to receive a greater amount of light L or light L'. In some embodiments, the third conductive layer 104 may be manufactured on the same substrate as the pixel circuit.

Figure 4B:
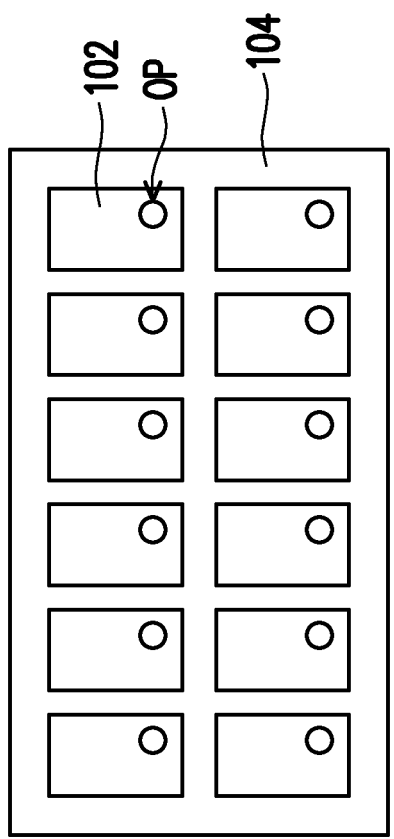
FIGS. 4B to 4D are schematic views of a pixel circuit and a third conductive layer according to multiple embodiments.
Figure 4C:
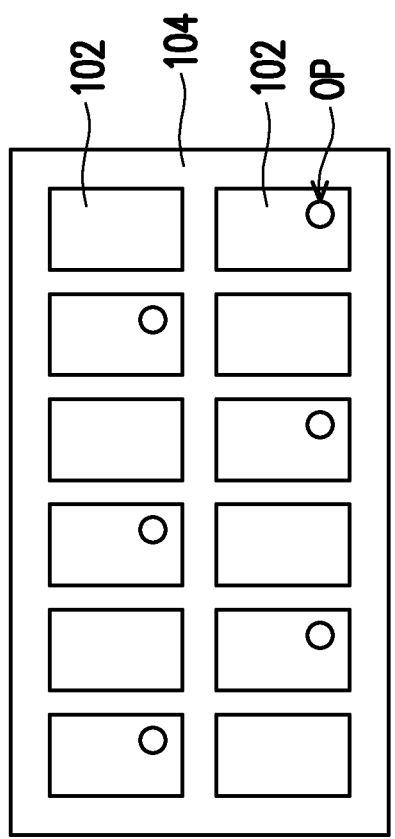
Figure 4D:
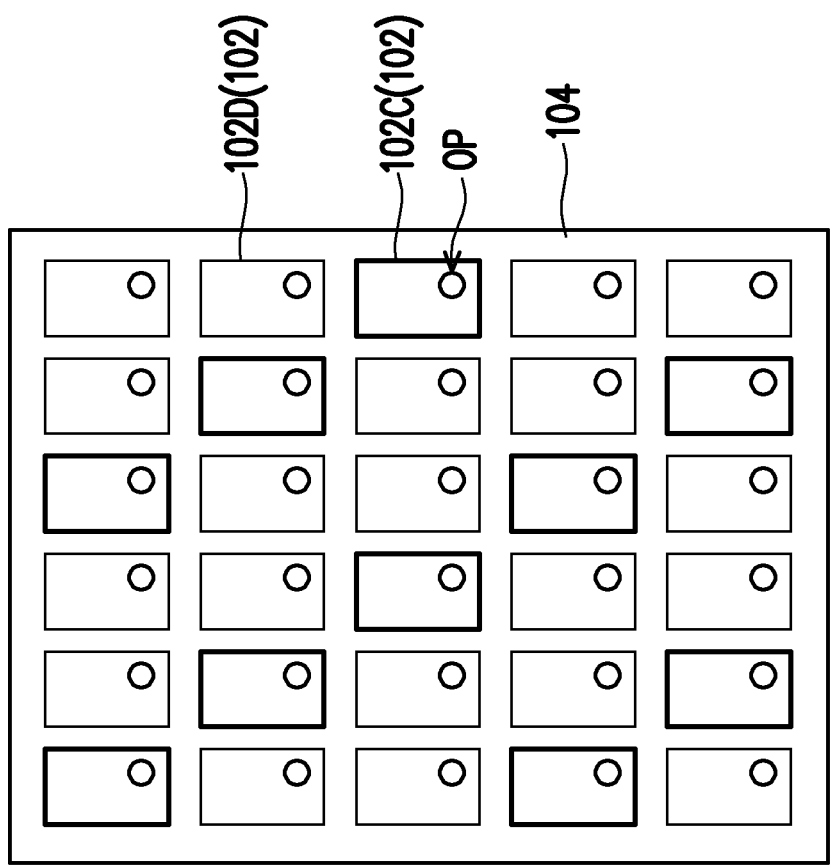

FIGS. 4B to 4D are schematic views of a pixel circuit and a third conductive layer according to multiple embodiments. In FIG. 4B, the third conductive layer 104 may have multiple openings OP, and the number of the openings OP may be approximately equal to the number of the pixel circuits 102. In FIG. 4C, the third conductive layer 104 may have multiple openings OP, and the number of the openings OP may be less than the number of the pixel circuits 102. Each opening OP may correspond to one of the pixel circuits 102, and some of the pixel circuits 102 have no corresponding openings OP. In FIG. 4D, the third conductive layer 104 may have multiple openings OP, and each pixel circuit 102 corresponds to at least one of the openings OP. Additionally, the pixel circuit 102 may include a pixel circuit 102C (indicated by a bold frame) that is electrically connected to the third conductive layer 104 and a pixel circuit 102D that is not electrically connected to the third conductive layer 104. In this way, the third conductive layer 104 may be electrically connected to a reference voltage through the connected pixel circuit 102C instead of being electrically floating. In some embodiments, each of the pixel circuits 102 may be electrically connected to the third conductive layer 104; that is, each of the pixel circuits 102 is the pixel circuit 102C. In some embodiments, only one of the pixel circuits 102 is electrically connected to the third conductive layer 104; that is, only one of the pixel circuits 102 is the pixel circuit 102C.

Figure 5A:
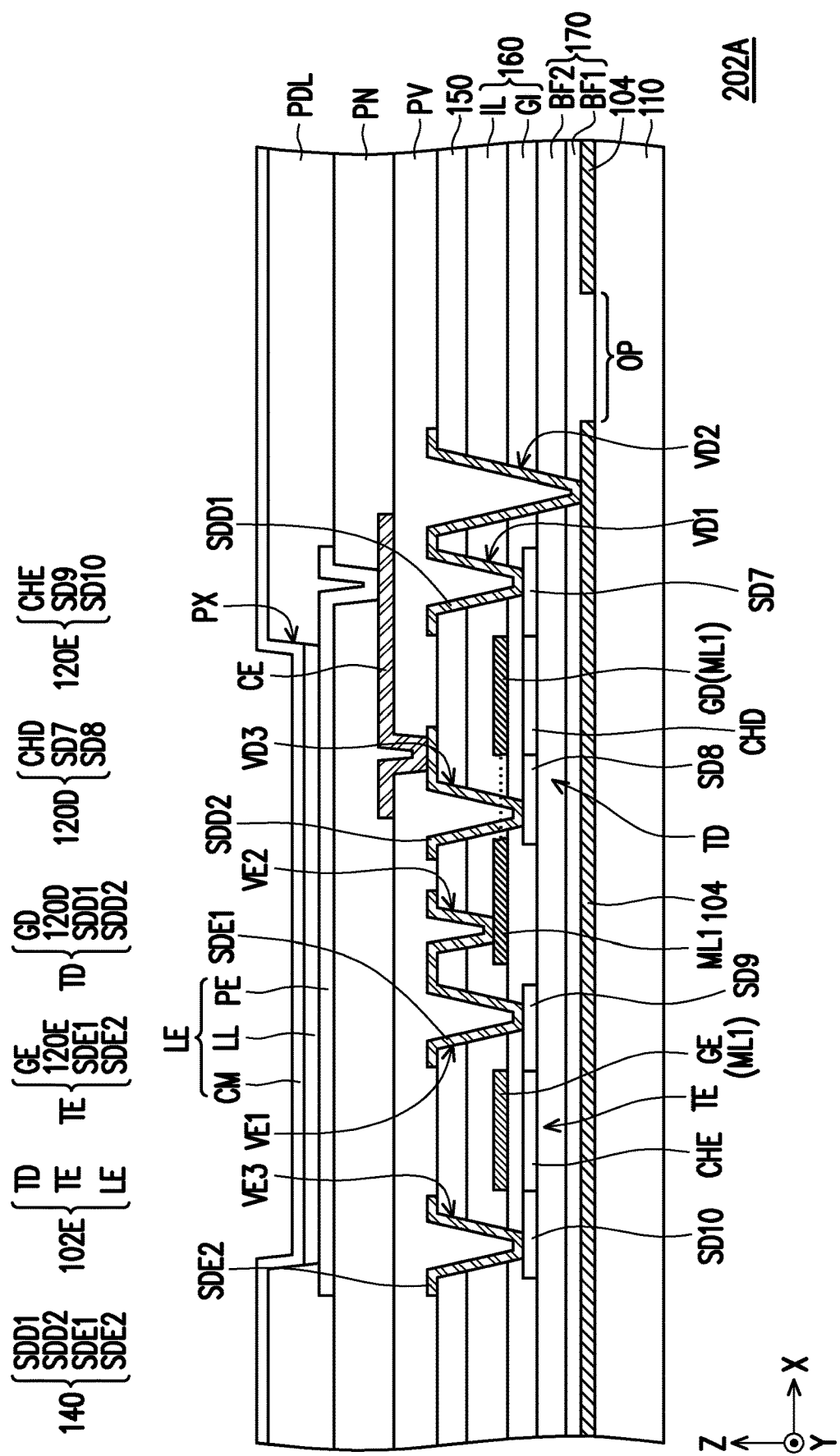
FIG. 5A is a schematic cross-sectional view of an electronic device according to an embodiment of the disclosure.

FIG. 5A is a schematic cross-sectional view of an electronic device according to an embodiment of the disclosure. The cross-section of FIG. 5A may be regarded as an embodiment of the display device 202 in the electronic device of FIG. 4A, and FIG. 5A omits the sensor 106 in FIG. 4A. Specifically, a display device 202A includes a pixel circuit 102E and a third conductive layer 104. The cross-sectional structure of FIG. 5A may be used in an embodiment of the pixel circuit 102C in FIG. 4D to illustrate the electrical connection relationship of the third conductive layer 104, but the disclosure is not limited thereto. The pixel circuit 102E includes an active element TD, an active element TE, and a light emitting element LE. Both the third conductive layer 104 and the pixel circuit 102E are disposed on the substrate 110, and the active element TD, the active element TE and the light emitting element LE are farther from the substrate 110 than the third conductive layer 104. That is, the third conductive layer 104 is located between the pixel circuit 102E and the substrate 110. In addition, the active element TD is electrically connected to the third conductive layer 104. That is, the third conductive layer 104 is not electrically floating. In addition, the display device 202A further includes layers of insulating materials for isolating different conductive layers, such as the third insulating layer 170, the first insulating layer 105, the second insulating layer 160, the passivation layer PV, the planarization layer PN, and the pixel definition Layer PDL. For the stacking relationship of these insulating layers, reference may be made to the embodiment of FIG. 2, but the disclosure is not limited thereto.

In this embodiment, the active device TD includes a semiconductor 120D, a gate GD, a source-drain SDD1 and a source-drain SDD2. The semiconductor 120D includes a channel region CHD, a source-drain region SD7 and a source-drain region SD8. The active element TE includes a semiconductor 120E, a gate GE, a source-drain SDE1 and a source-drain SDE2. The semiconductor 120E includes a channel region CHE, a source-drain region SD9 and a source-drain region SD10. The third insulating layer 170 is disposed on the substrate 110 and covers the third conductive layer 104. The semiconductor 120D and the semiconductor 120E are similar to the semiconductor 120A and the semiconductor 120B of FIG. 2, respectively. The gate GD and the gate GE are similar to the gate GA and the gate GB of FIG. 2, respectively. For the descriptions of the similar components in the two embodiments, one may refer to the descriptions of both embodiments for more details, and the descriptions will not be repeated. In some embodiments, the display device 202A further includes the first conductive layer 130 shown in FIG. 2, and the first conductive layer 130 is located between the interlayer insulating layer IL of the second insulating layer 160 and the first insulating layer 150, but it is not shown in FIG. 5A. The source-drain SDD1, the source-drain SDD2, the source-drain SDE1 and the source-drain SDE2 are configured by the same conductive layer, for example, by the second conductive layer 140 shown in FIG. 2, and the second conductive layer 140 is disposed on the first insulating layer 150. The source-drain SDD1 and the source-drain SDD2 are respectively connected to the source-drain region SD7 and the source-drain region SD8; and the source-drain SDE1 and the source-drain SDE2 are respectively connected to the source-drain region SD9 and the source-drain region SD10.

In this embodiment, the source-drain SDD1 is electrically connected to the source-drain region SD7 through a first via VD1, and the second conductive layer 140 is electrically connected to the third conductive layer 104 through a second via VD2. In addition, the source-drain SDD2 is electrically connected to the source-drain region SD8 through the third via VD3. Similarly, the source-drain SDE1 is electrically connected to the source-drain region SD9 through a first via VE1, and the second conductive layer 140 is electrically connected first to the conductive layer ML1 and then to the gate GD of the active element TD through a second via VE2. In addition, the source-drain SDE2 is connected to the source-drain region SD10 through the third via VE3. In FIG. 5A, the gate GD and the conductive layer ML1 located on two sides of the source-drain SDD2 are electrically connected to each other, and are substantially configured by the same conductor pattern. Therefore, the dotted line in FIG. 5A indicates that the relationship that two parts are electrically connected to each other.

In FIG. 5A, the first via VD1, the third via VD3, the first via VE1 and the third via VE3 are configured to electrically connect the second conductive layer 140 to the semiconductor 120D and the semiconductor 120E, for example, by penetrating the first insulating layer 150 and the second insulating layer 160. The second via VD2 is configured to connect the second conductive layer 140 to the third conductive layer 104. The second via VE2 is configured to connect the second conductive layer 140 to the conductive layer ML1. Therefore, the depths of these vias are different. However, in this embodiment, the first via VD1, the second via VD2, the third via VD3, the first via VE1, the second via VE2 and the third via VE3 may be formed by the same mask in the same lithography-etching process. This helps to simplify the via forming step, and there is no need to use multiple layers of conductive layers to realize the electrical connection between the second conductive layer 140 and multiple different layers in a complicated manner.

In some embodiments, the first via VD1, the third via VD3, the first via VE1 and the third via VE3 have the same depth. The depth of the second via VD2 is greater than the depth of the first via VD1, and the depth of the first via VE1 is greater than the depth of the second via VE2. The mask forming these vias may be designed so that deeper vias correspond to larger mask pattern sizes and may be formed as vias with larger widths. Therefore, taking the active element TD as an example, the width of the second via VD2 may be greater than the width of the first via VD1. Similarly, taking the active element TE as an example, the width of the first via VE1 may be greater than the width of the second via VE2. In some embodiments, the first via VD1, the third via VD3, the first via VE1 and the third via VE3 may have the same width, but the disclosure is not limited thereto.

In this embodiment, the source-drain SDD1 formed by the second conductive layer 140 are configured to receive a power signal, for example, and the first via VD1 and the second via VD2 allow the second conductive layer 140 to electrically connect the third conductive layer 104 and the semiconductor 120D. Therefore, the display device 202A may transmit the power signal to the third conductive layer 104 through the second conductive layer 140, so that the third conductive layer 104 is not electrically floating. Although the third conductive layer 104 is adjacent to the channel region CHD and the channel region CHE, it is not electrically floating, and is less likely to interfere with the electrical characteristics of the active element TD and the active element TE.

In FIG. 5A, the light emitting element LE includes a pixel electrode PE, a light emitting layer LL, and a common electrode CM, and the light emitting layer LL is disposed in the pixel opening PX defined by the pixel definition layer PDL. The pixel electrode PE may be electrically connected to the source-drain SDD2 of the active element TD through the connection electrode CE, and the connection electrode CE is disposed between the passivation layer PV and the planarization layer PN. The structure is similar to that of FIG. 2, and similar components are designated by the same reference numerals in FIG. 5A; therefore, for the components with the same reference numerals, one may refer to the descriptions of both or all for more details, and the descriptions will not be repeated here. In addition, in FIG. 5A, the third conductive layer 104 has the opening OP, and the opening OP may not overlap the active element TD and the active element TE in the pixel circuit 102E. Therefore, the display device 202A may allow a light to pass through at the opening OP.

Figure 5B:
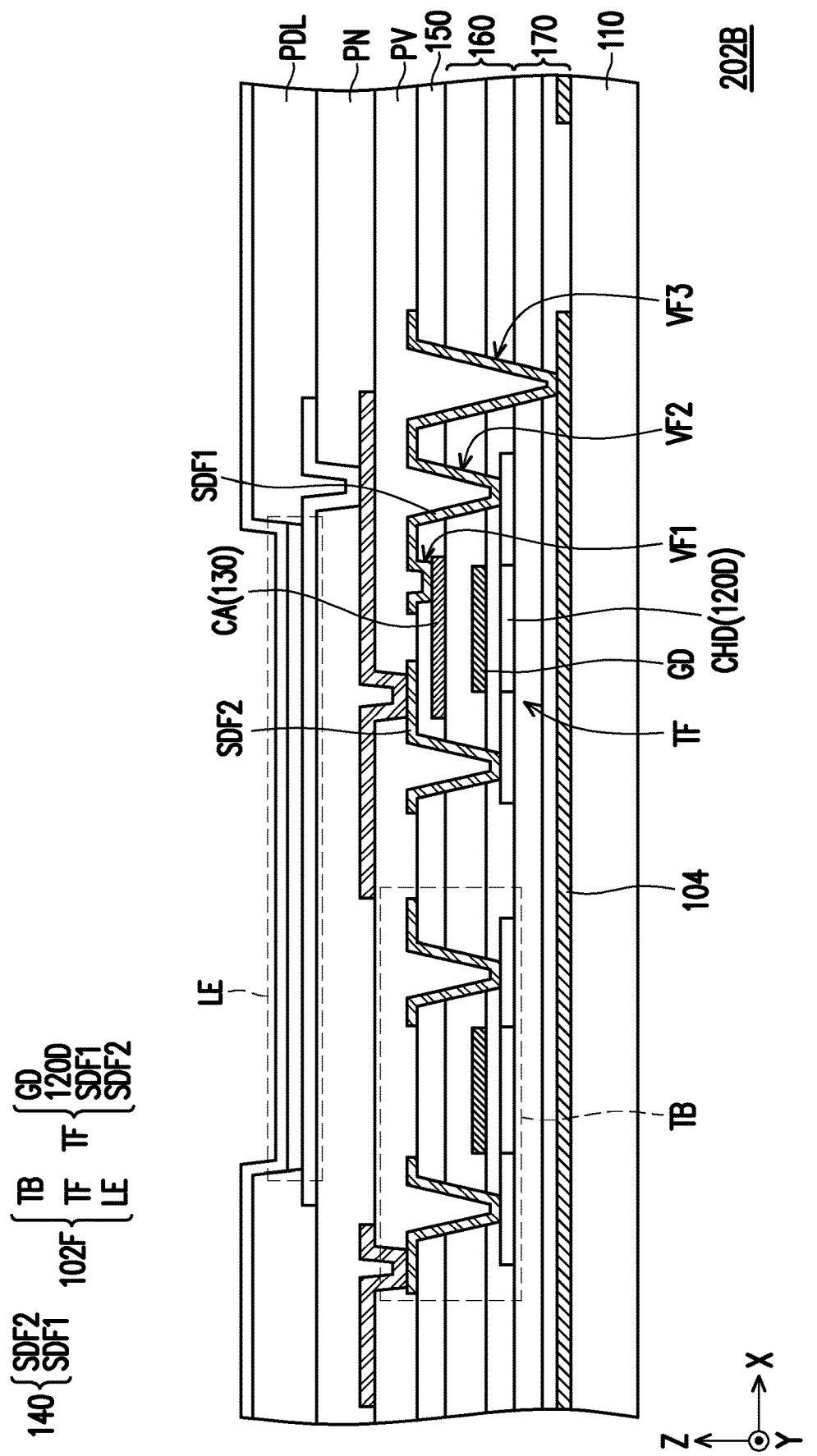
FIG. 5B is a schematic cross-sectional view of an electronic device according to an embodiment of the disclosure.

FIG. 5B is a schematic cross-sectional view of an electronic device according to an embodiment of the disclosure. The cross-section of FIG. 5B may be regarded as an embodiment of the display device 202 in the electronic device of FIG. 4A, and FIG. 5B omits the sensor 106 in FIG. 4A. The display device 202B in FIG. 5B includes a pixel circuit 102F configured by an active element TB, an active element TF, and a light emitting element LE, and for the active element TB and the light emitting element LE, reference may be made to the related description of FIG. 2. The pixel circuit 102F may serve as an embodiment of the pixel circuit 102C in FIG. 4D to illustrate the electrical connection relationship of the third conductive layer 104, but the disclosure is not limited thereto. The active element TF includes a gate GD, a semiconductor 120D, a source-drain SDF1 and a source-drain SDF2, and for the specific structures of the gate GD, the semiconductor 120D and the source-drain SDD2, reference may be made to the description of FIG. 5A. In addition, the display device 202B of FIG. 5B further includes a first conductive layer 130, and the first conductive layer 130 may configure a capacitor electrode CA. The second conductive layer 140 configuring the source-drain SDF1 may be electrically connected to the first conductive layer 130, the semiconductor 120D and the third conductive layer 104 at the same time.

In this embodiment, the source-drain SDF1 and the source-drain SDF2 are also configured by the second conductive layer 140 of FIG. 5A. The first insulating layer 150 is disposed between the first conductive layer 130 and the second conductive layer 140. The second insulating layer 160 is disposed between the first conductive layer 130 and the semiconductor 120D. The third insulating layer 170 is disposed between the semiconductor 120D and the third conductive layer 104. In addition, the second conductive layer 140 may be electrically connected to the first conductive layer 130 through a first via VF1, may be electrically connected to the semiconductor 120D through a second via VF2, and may be electrically connected to a third conductive layer 104 through the third via VF1. The first via VF1 penetrates the first insulating layer 150. The second via VF2 penetrates the first insulating layer 150 and the second insulating layer 160. The third via VF3 penetrates the first insulating layer 150, the second insulating layer 160 and the third insulating layer 170.

The first via VF1, the second via VF2 and the third via VF3 may be manufactured by using the same mask in the same lithography-etching step. In some embodiments, a width of the first via VF1 is less than a width of the second via VF2, and a width of the third via VF3 is greater than the width of the second via VF2. In some embodiments, the width of the first via VF1 satisfies the following equation: $0.82*X+1.63\ \mu m \leq Y \leq 0.82*X+2.43\ \mu m$, where Y is the width of the first via VF1 in $\mu m$, X is the depth of the first via VF1 in $\mu m$, and X is greater than or equal to 0 $\mu m$ and less than or equal to 3 $\mu m$. In some embodiments, the width of the first via VF1 further satisfies the following equation: $0.82*X+1.83\ \mu m \leq Y \leq 0.82*X+2.23\ \mu m$.

In this embodiment, the second conductive layer 140 is configured to receive a power signal, for example, and the first via VF1, the second via VF2 and the third via VF3 allow the second conductive layer 140 to electrically connect the first conductive layer 130, the semiconductor 120D and the third conductive layer 104. Therefore, the display device 202B may transmit the power signal to the first conductive layer 130 and the third conductive layer 104 through the second conductive layer 140, so that the first conductive layer 130 and the third conductive layer 104 are not electrically floating. The third conductive layer 104 is less likely to interfere with the electrical characteristics of the active element TF and the active element TE.

Figure 5C:
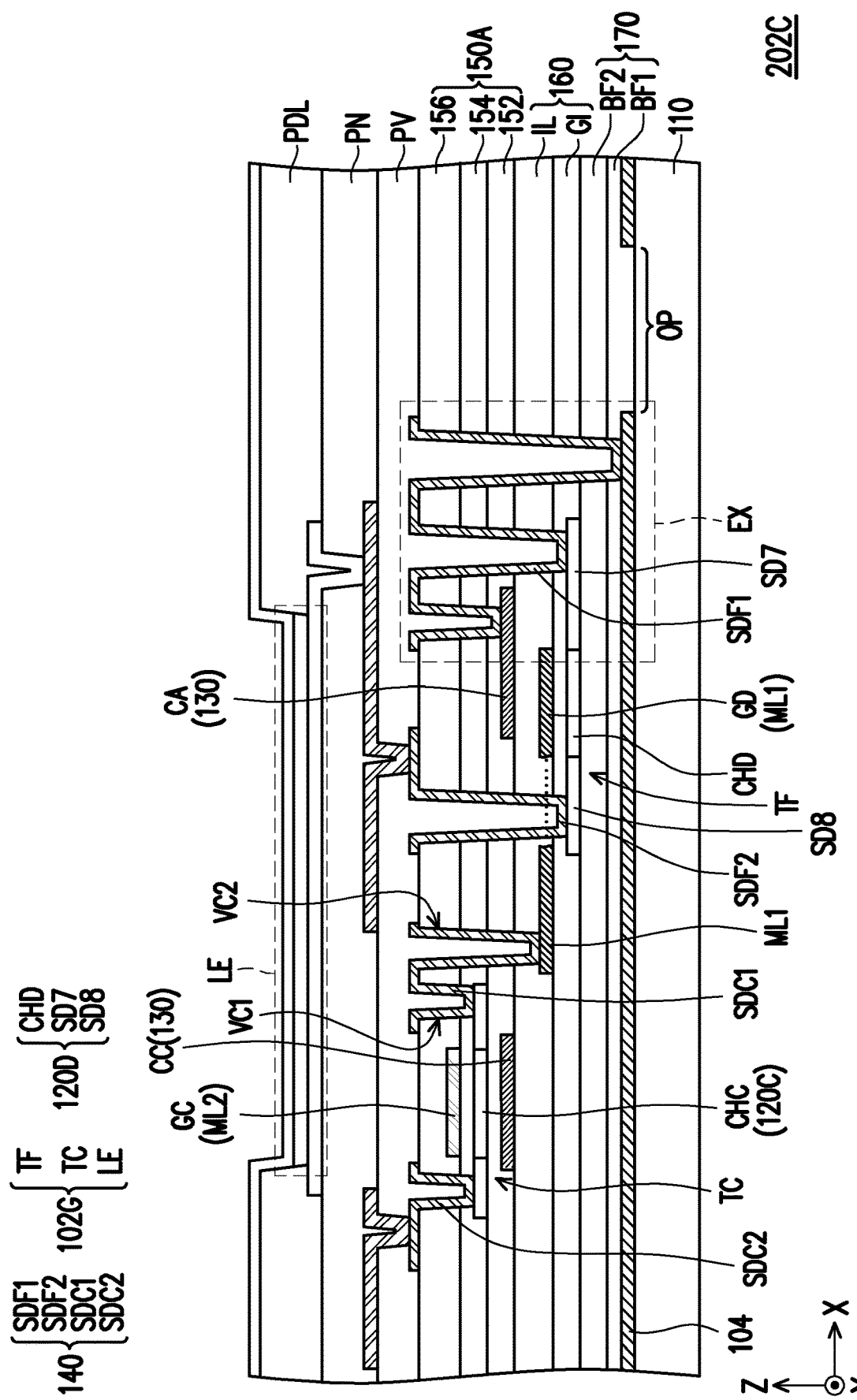
FIG. 5C is a schematic cross-sectional view of an electronic device according to an embodiment of the disclosure.

In some embodiments, the active element TB in FIG. 5B may be replaced by the active element TC in FIG. 3 or the active element TE in FIG. 5A. That is, the active element TB in FIG. 2, the active element TC in FIG. 3, and the active element TE in FIG. 5A may be interchangeable with each other. For example, FIG. 5C is a schematic cross-sectional view of an electronic device according to an embodiment of the disclosure. The display device 202C of FIG. 5C includes an active element TC, an active element TF, a light emitting element LE and a third conductive layer 104; for the active element TC, reference may be made to the related description in FIGS. 3; and for the active element TF, reference may be made to the related description in FIG. 5B. The active element TC, the active element TF, and the light emitting element LE may configure a pixel circuit 102G. The pixel circuit 102G may serve as an embodiment of the pixel circuit 102C in FIG. 4D to illustrate the electrical connection relationship of the third conductive layer 104, but the disclosure is not limited thereto.

The active element TF includes a gate GD, a semiconductor 120D, a source-drain SDF1 and a source-drain SDF2. The gate GD of the active element TF is configured by, for example, a conductive layer ML1 between the gate insulating layer GL and the interlayer insulating layer IL of the second insulating layer 160. The semiconductor 120D between the second insulating layer 160 and the third insulating layer 170 includes the channel region CHD and the source-drain region SD7 and the source-drain region SD8 located on two sides of the channel region CHD. A capacitor electrode CA is disposed above the gate GD of the active element TF, and the capacitor electrode CA is configured by the first conductive layer 130 between the first insulating layer 150A and the second insulating layer 160. The source-drain SDF1 and the source-drain SDF2 are disposed on the first insulating layer 150A and are configured by the second conductive layer 140.

The active element TC includes a semiconductor 120C, a gate GC, a source-drain SDC1 and a source-drain SDC2. The first insulating layer 150A may include an insulating sub-layer 152, an insulating sub-layer 154 and an insulating sub-layer 156. The semiconductor 120C is located between the insulating sub-layer 152 and the insulating sub-layer 154, and the gate GC is located between the insulating sub-layer 154 and the insulating sub-layer 156. Therefore, the semiconductor 120D of the active element TF and the semiconductor 120C of the active element TC are located in different layers. In some embodiments, the semiconductor 120D and the semiconductor 120C may include different materials; for example, one of them includes silicon and the other includes metal oxide, but the disclosure is not limited thereto. The gate GC of the active element TC is configured by, for example, the conductive layer ML2 between the insulating sub-layer 154 and the insulating sub-layer 156 of the first insulating layer 150A. In addition, an electrode CC may be further disposed between the semiconductor 120C of the active element TC and the substrate 110, and it is configured by the first conductive layer 130 and is the same layer as the capacitor electrode CA. In the display device 202C of FIG. 5C, the conductive layer ML1 configuring the gate GD of the active element TF may extend outward and be larger than the semiconductor 120D, and the source-drain SDC1 of the active element TC may be electrically connected first to the conductive layer ML1 and then to the gate GD through the second conductive layer 140. Specifically, the source-drain SDC1 of the active element TC may be electrically connected to the semiconductor 120C through the first via VC1, and may be electrically connected to the conductive layer ML1 through the second conductive layer 140 through the second via VC2. In this embodiment, a width of the first via VC1 may be less than a width of the second via VC2. In addition, in FIG. 5C, the gate GD and the conductive layer ML1 located on two sides of the source-drain SDF2 are electrically connected to each other, so the relationship of this electrical connection is indicated by a dotted line in FIG. 5C.

Figure 5D:
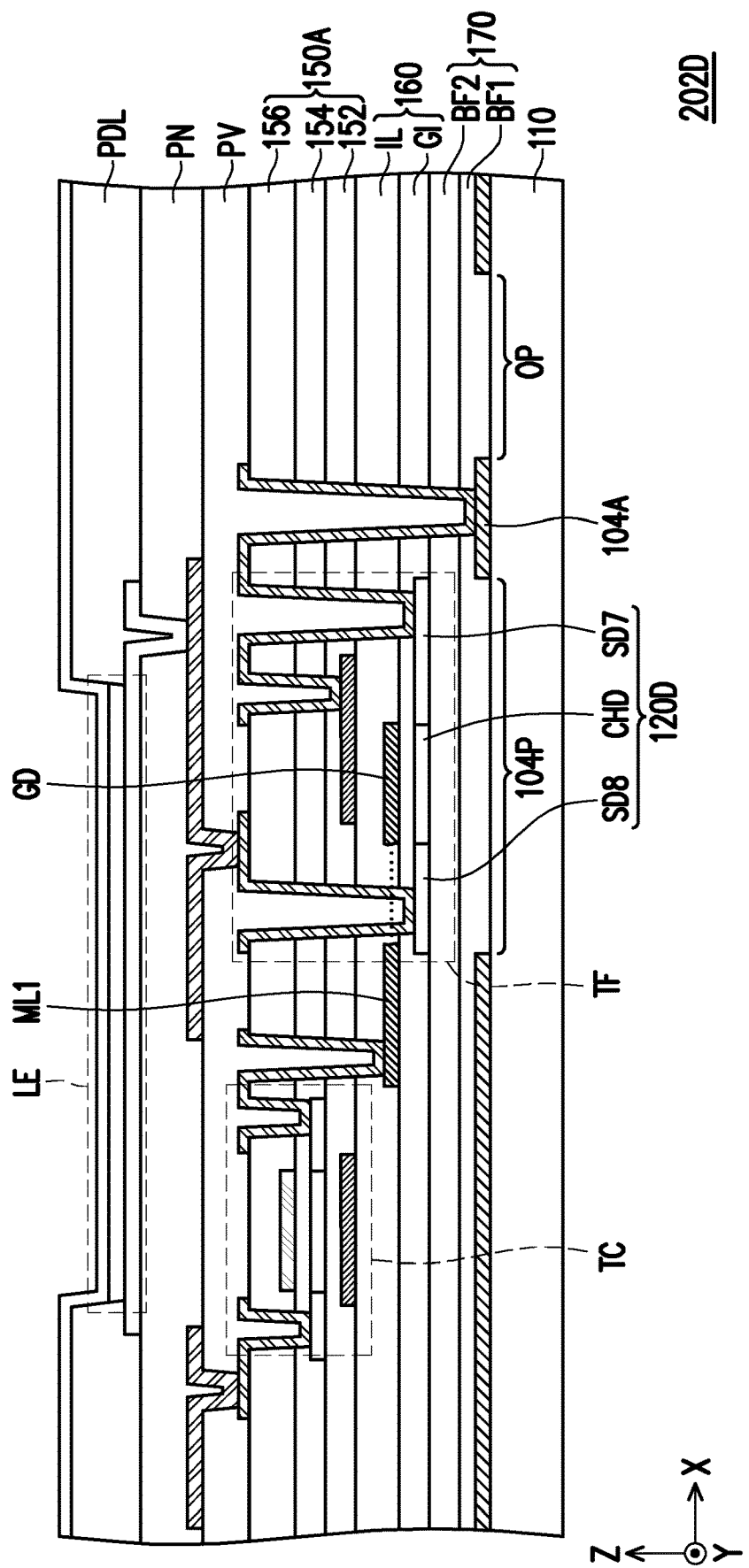
FIG. 5D is a schematic cross-sectional view of an electronic device according to an embodiment of the disclosure.

FIG. 5D is a schematic cross-sectional view of an electronic device according to an embodiment of the disclosure. The display device 202D of FIG. 5D includes an active element TF, an active element TC, a light emitting element LE and a third conductive layer 104A disposed on the substrate 110; for the active element TF, the active element TC, the light emitting element LE, and the multiple insulating layers for separating the individual conductive layers, reference may be made to the description of FIG. 5C and related embodiments, and the descriptions will not be repeated. The display device 202D is different from the display device 202C in the structure of the third conductive layer 104A, so for other components, reference may be made to the description of FIG. 5C. For example, the gate GD and the conductive layer ML1 located on two sides of the source-drain SDF2 are electrically connected to each other, so the relationship of this electrical connection is indicated by a dotted line in FIG. 5D. In this embodiment, the third conductive layer 104A further includes an opening 104P corresponding to the active element TF in addition to the opening OP allowing light to pass through. In some embodiments, the opening 104P may reduce the overlapping region of the third conductive layer 104A and the semiconductor 120D, thereby reducing the influence on the electrical performance of the active element TF.

Figure 5E:
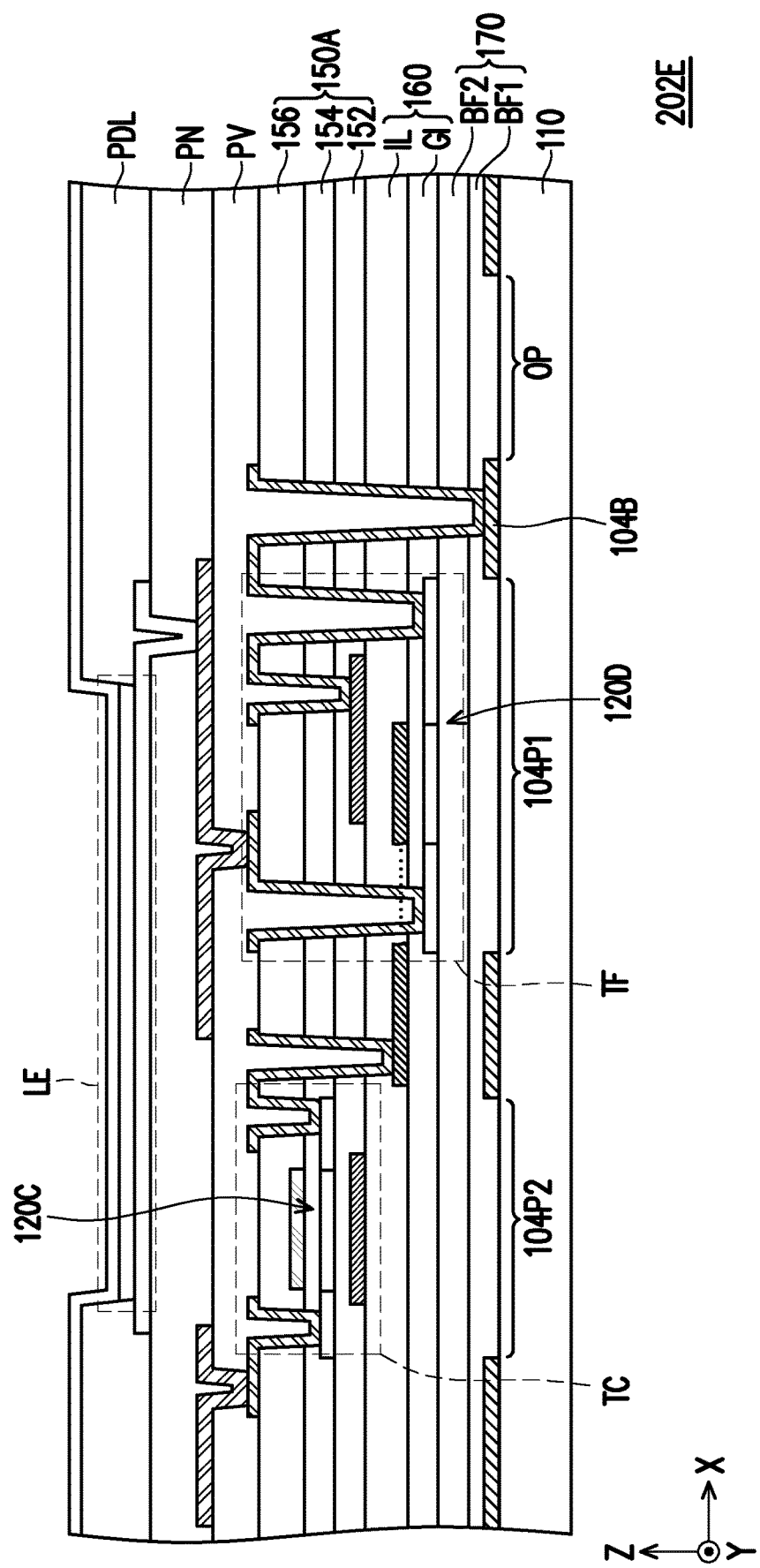
FIG. 5E is a schematic cross-sectional view of an electronic device according to an embodiment of the disclosure.

FIG. 5E is a schematic cross-sectional view of an electronic device according to an embodiment of the disclosure. The display device 202E of FIG. 5E includes an active element TF, an active element TC, a light emitting element LE and a third conductive layer 104B disposed on the substrate 110; for the active element TF, the active element TC, the light emitting element LE, and the multiple insulating layers for separating the individual conductive layers, reference may be made to the description of FIG. 5C and related embodiments, and the descriptions will not be repeated. The display device 202E is different from the display device 202C in the structure of the third conductive layer 104B, so for other components, reference may be made to the description of FIG. 5C. In this embodiment, the third conductive layer 104B further includes an opening 104P1 corresponding to the semiconductor 120D in the active element TF and an opening 104P2 corresponding to the semiconductor 120C in the active element TC in addition to the opening OP allowing light to pass through. In some embodiments, the opening 104P1 may reduce the influence of the third conductive layer 104B on the electrical performance of the semiconductor 120D. Similarly, the opening 104P2 may reduce the influence of the third conductive layer 104B on the electrical performance of the semiconductor 120C.

Figure 6:
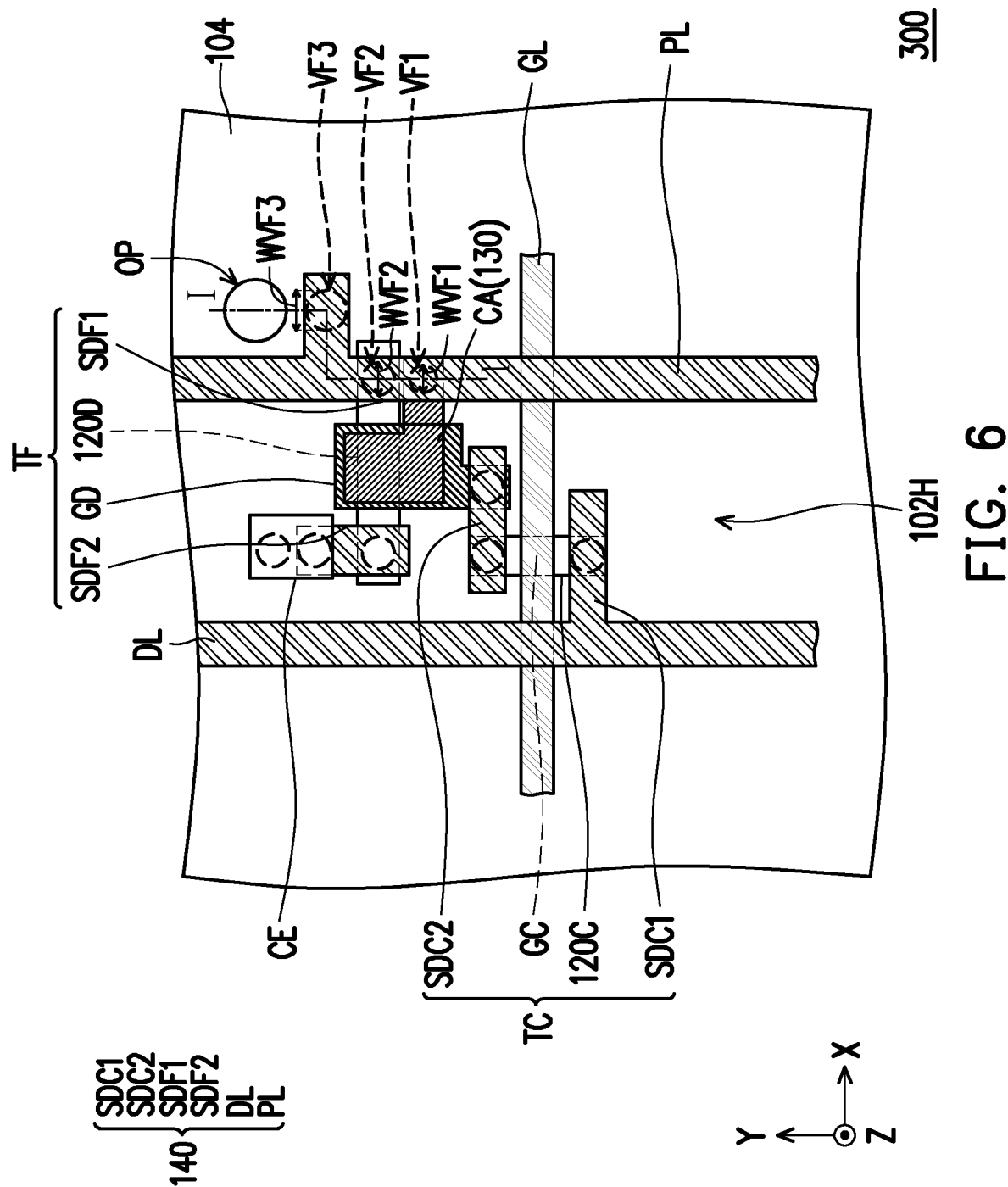
FIG. 6 is a schematic partial top view of an electronic device according to an embodiment of the disclosure.

FIG. 6 is a schematic partial top view of an electronic device according to an embodiment of the disclosure. FIG. 6 shows a part of a pixel circuit 102H of an electronic device 300 and a part of a third conductive layer 104. The third conductive layer 104 is substantially similar to the third conductive layer 104 in the foregoing embodiments, and has an opening OP that allows light to pass through. In FIG. 6, the pixel circuit 102H of the electronic device 300 includes at least an active element TF and an active element TC. The active element TF includes a semiconductor 120D, a gate GD, a source-drain SDF1 and a source-drain SDF2; for the cross-sectional structure of the active element TF, reference may be made to the active element TF in FIG. 5C. The active element TC includes a semiconductor 120C, a gate GC, a source-drain SDC1 and a source-drain SDC2; for the cross-sectional structure of the active element TC, reference may be made to the active element TC in FIG. 5C. In addition, the electronic device 300 includes a gate line GL, a data line DL, and a power line PL. The extending directions of the data line DL and the power line PL are different from the extending direction of the gate line GL, and, for example, they may be perpendicular to each other, but the disclosure is not limited thereto.

As shown in FIG. 6, the gate GC of the active element TC is configured by the part where the gate line GL overlaps the semiconductor 120C, and the source-drain SDC1 is configured by a branch extending from the data line DL, but the disclosure is not limited thereto. The source-drain SDC2 of the active element TC are electrically connected to the semiconductor 120C and the gate GD of the active element TF. The gate GD of the active element TF may overlap with the semiconductor 120D and overlap with the capacitor electrode CA. The source-drain SDF1 of the active element TF may be configured by a part of the power line PL. The source-drain SDF2 of the active element TF may be electrically connected to the semiconductor 120D and the connection electrode CE.

In the embodiment, for the capacitor electrode CA, reference may be made to the description of the foregoing embodiments, and the capacitor electrode CA is, for example, configured by the first conductive layer 130 as described above. The source-drain SDC1, the source-drain SDC2, the source-drain SDF1, the source-drain SDF2, the data line DL, and the power line PL are, for example, configured by the second conductive layer 140 as described above. It may be seen from FIG. 6 that the part of the second conductive layer 140 that configures the source-drain SDF1 may be electrically connected to the capacitor electrode CA configured by the first conductive layer 130 through the first via VF1, may be electrically connected to the semiconductor 120D through the second via VF2, and may be electrically connected to the third conductive layer 104 through the third via VF3. Here, a width WVF1 of the first via VF1 is less than a width WVF2 of the second via VF2, and a width WVF3 of the third via VF3 is greater than the width WVF2 of the second via VF2.

Figure 7:
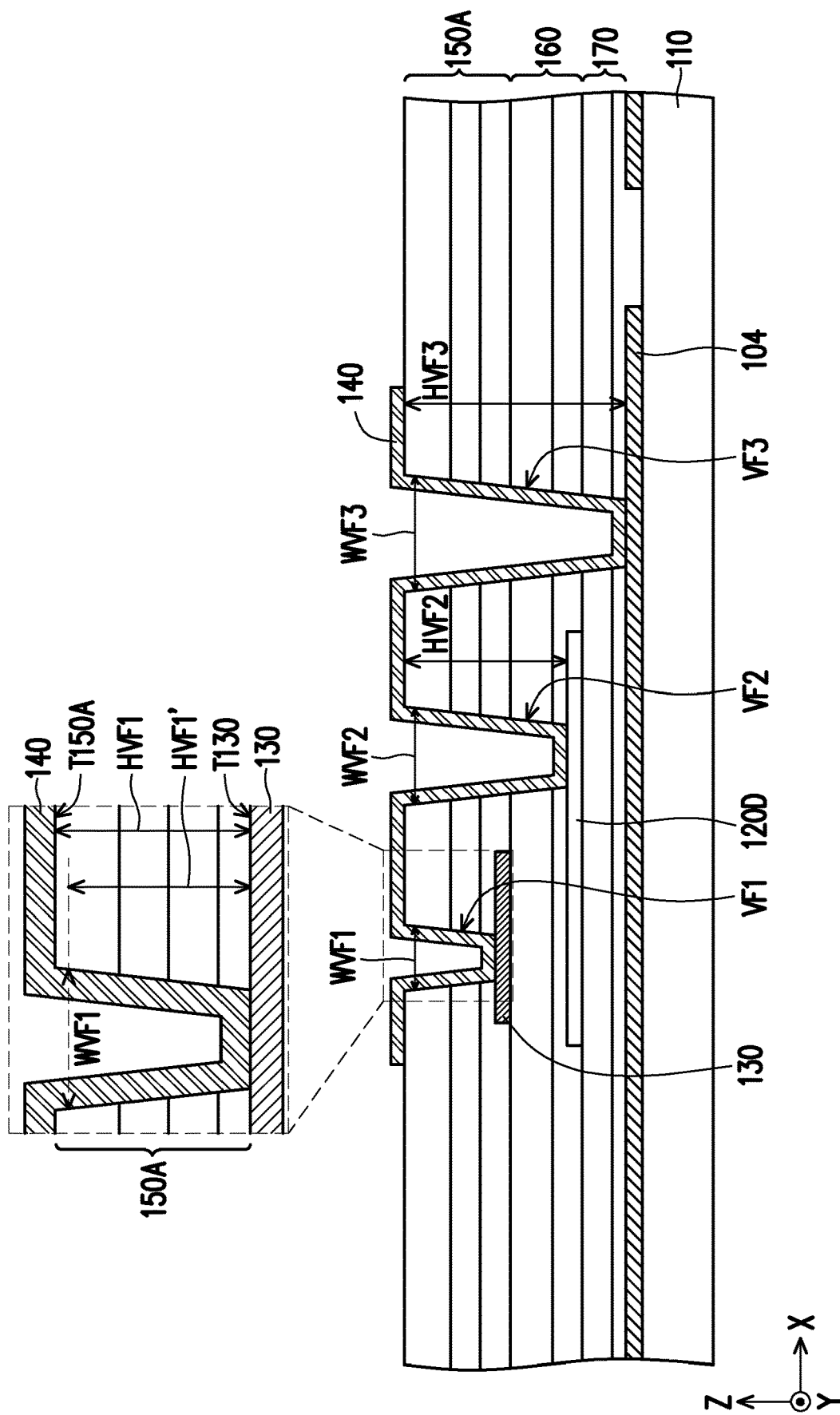
FIG. 7 is a schematic partial cross-sectional view taken along the line I-I in FIG. 6.

FIG. 7 is a schematic partial cross-sectional view taken along the line I-I in FIG. 6. For the clarity of the illustration, some layers are omitted in FIG. 7, and for the omitted layers, reference may be made to any one of FIGS. 2, 3, 5A and 5B. As may be seen from FIG. 7, the semiconductor 120D, the first conductive layer 130, the second conductive layer 140 and the third conductive layer 104 are disposed on the substrate 110, which may correspond to the semiconductor 120D, the capacitor electrode CA, and the source-drain SDF1 in the line I-I of FIG. 6, respectively. In addition, the first insulating layer 150A is disposed between the first conductive layer 130 and the second conductive layer 140. The second insulating layer 160 is disposed between the first conductive layer 130 and the semiconductor 120D. The third insulating layer 170 is disposed between the semiconductor 120D and the third conductive layer 104. Here, for the first insulating layer 150A, the second insulating layer 160 and the third insulating layer 170, reference may be made to the descriptions of the foregoing embodiments. In other words, any of the first insulating layer 150A, the second insulating layer 160 and the third insulating layer 170 may include multiple insulating layers or may be configured by only a single insulating layer. In addition, in some embodiments, other conductive layers, semiconductor layers or other material layers may be additionally disposed between any two insulating layers.

With reference to FIG. 7, the second conductive layer 140 is disposed on the first insulating layer 150A and is electrically connected to the first conductive layer 130, the semiconductor 120D and the third conductive layer 104 through the first via VF1, the second via VF2 and the third via VF3, respectively. There are a distance HVF1 between the second conductive layer 140 and the first conductive layer 130, a distance HVF2 between the second conductive layer 140 and the semiconductor 120D, and a distance HVF3 between the second conductive layer 140 and the third conductive layer 104. The distance HVF1 is less than the distance HVF2, and the distance HVF2 is less than the distance HVF3. In some embodiments, the first via VF1 has a width WVF1; the second via VF2 has a width WVF2; and the third via VF3 has a width WVF3. The width WVF1 is less than the width WVF2, and the width WVF2 is less than the width WVF3.

In some embodiments, the vias have sloped sidewalls. Here, as shown in the partially enlarged region in FIG. 7, the first via VF1 serves as an example to illustrate the measurement method of the width of the individual vias in the disclosure. In any cross-sectional structure (such as an electronic device in any cross section), the distance between the second conductive layer 140 and its correspondingly connected layer (such as the first conductive layer 130) is measured along the normal direction of the substrate 110 (such as the direction Z); for example, the distance HVF1 from the top surface T150A of the first insulating layer 150A to the first conductive layer 130 is measured. For example, the distance HVF1 is obtained by measuring the distance along the direction Z from the top surface T150A of the substantially flat region of the first insulating layer 150A to the top surface T130 of the first conductive layer 130. Next, a depth HVF1' of the first via VF1 is defined as the distance from the top surface T130 of the first conductive layer 130 upward to 0.95*HVF1 along the direction Z, and the width WVF1 of the first via VF1 is measured at this point along a direction perpendicular to the normal of the substrate 110 (for example, the direction Y). Such a measurement method may be applied to the measurement of the width of all vias in the disclosure, but the disclosure is not limited thereto. In some embodiments, the depth and/or width of the first via VF1, the second via VF2, and the third via VF3 may be measured by the same cross section or different cross sections, but the disclosure is not limited thereto.

Figure 8A:
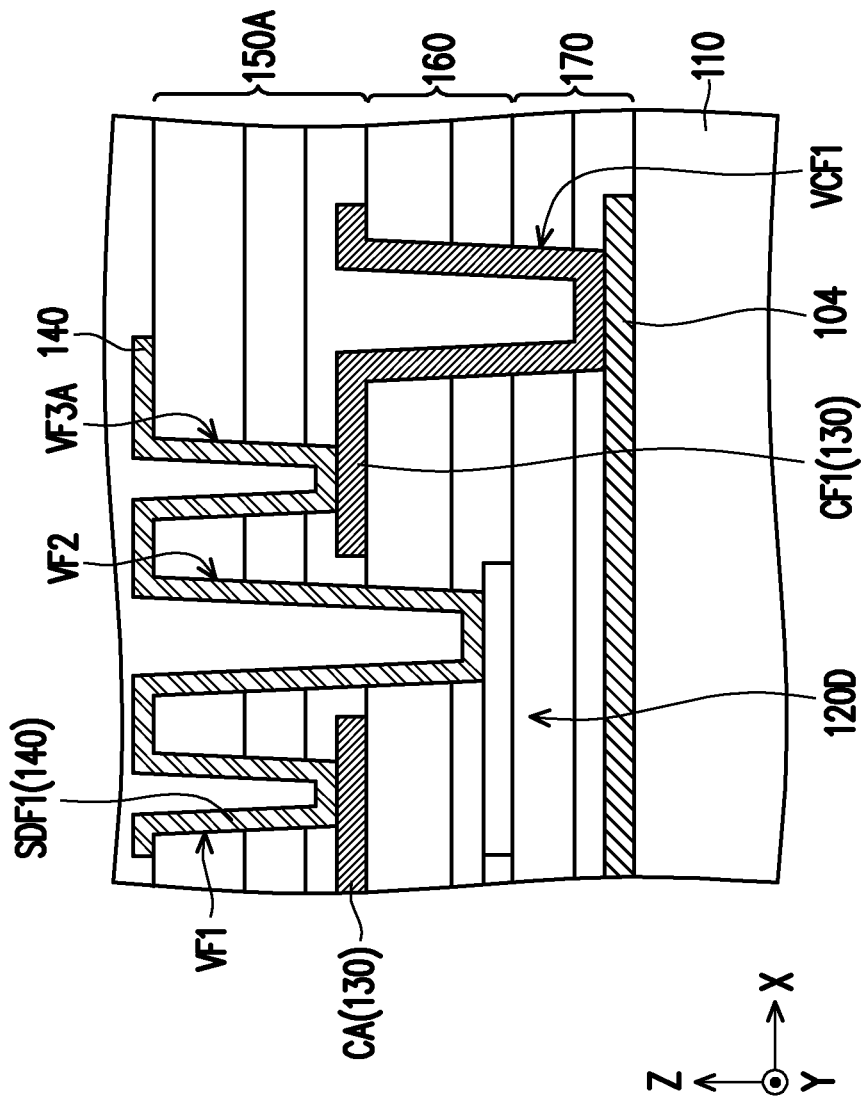
FIG. 8A is a schematic view of a connection relationship of a second conductive layer according to an embodiment of the disclosure.

FIG. 8A is a schematic view of a connection relationship of a second conductive layer 140 according to an embodiment of the disclosure. FIG. 8A may correspond to a region EX in FIG. 5C, and is used to illustrate an embodiment of the connection relationship of the second conductive layer 140. Therefore, the structure of FIG. 8A may be used to replace the region EX in FIG. 5C, and for the components designated by the same reference numerals in FIGS. 8A and 5C, one may refer to the descriptions of both for more details. In FIG. 8A, the first conductive layer 130 includes a connection conductor CF1 in addition to the capacitor electrode CA. In addition, the second conductive layer 140 may be electrically connected to the capacitor electrode CA of the first conductive layer 130, the semiconductor 120D and the connection conductor CF1 of the first conductive layer 130 through the first via VF1, the second via VF2 and the third via VF3A, respectively. Meanwhile, the connection conductor CF1 of the first conductive layer 130 may be electrically connected to the third conductive layer 104 through a via VCF1. Here, the third via VF3A, for example, penetrates the first insulating layer 150A and extends to the connection conductor CF1, and the via VCF1 penetrates the second insulating layer 160 and the third insulating layer 170 and extends to the third conductive layer 104.

Figure 8B:
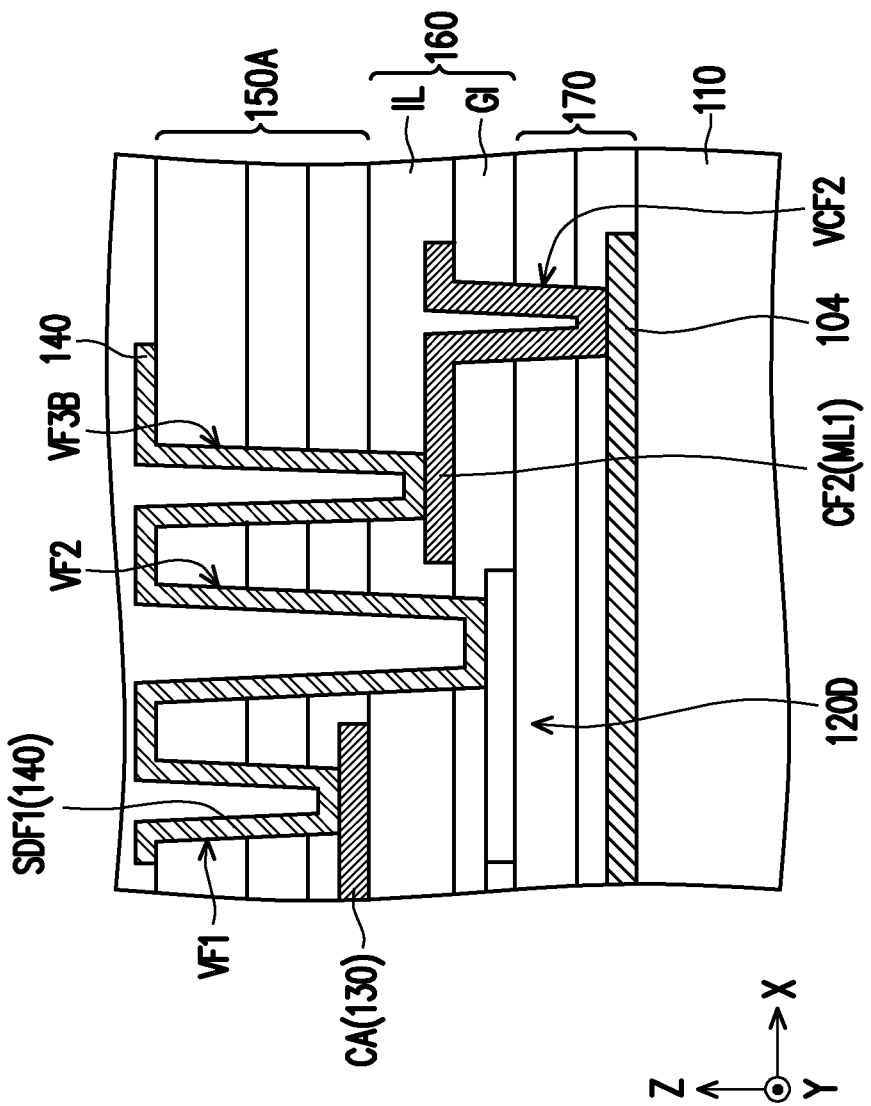
FIG. 8B is a schematic view of a connection relationship of a second conductive layer according to an embodiment of the disclosure.

FIG. 8B is a schematic view of a connection relationship of a second conductive layer according to an embodiment of the disclosure. FIG. 8B may correspond to the region EX in FIG. 5C, and is used to illustrate an embodiment of the connection relationship of the second conductive layer. Therefore, the structure of FIG. 8B may be used to replace the region EX in FIG. 5C, and for the components designated by the same reference numerals in FIGS. 8B and 5C, one may refer to the descriptions of both for more details. In FIG. 8B, a connection conductor CF2 is disposed between the gate insulating layer GI and the interlayer insulating layer IL of the second insulating layer 160. When FIG. 8B is applied to the embodiment of FIG. 5C, the connection conductor CF2 and the gate GD of the active element TF are the same layer, that is, the conductive layer ML1. Therefore, the connection conductor CF2 may be integrated into the layer of the active element TF. The second conductive layer 140 may be electrically connected to the capacitor electrode CA of the first conductive layer 130, the semiconductor 120D and the connection conductor CF2 of the conductive layer ML1 through the first via VF1, the second via VF2 and the third via VF3B, respectively. Meanwhile, the connection conductor CF2 130 may be electrically connected to the third conductive layer 104 through a via VCF2. Here, the third via VF3B, for example, penetrates the first insulating layer 150A and the interlayer insulating layer IL of the second insulating layer 160 and extends to the connection conductor CF2, and the via VCF2 penetrates the gate insulating layer GI of the second insulating layer 160 and the third insulating layer 170 and extends to the third conductive layer 104.

Figure 8C:
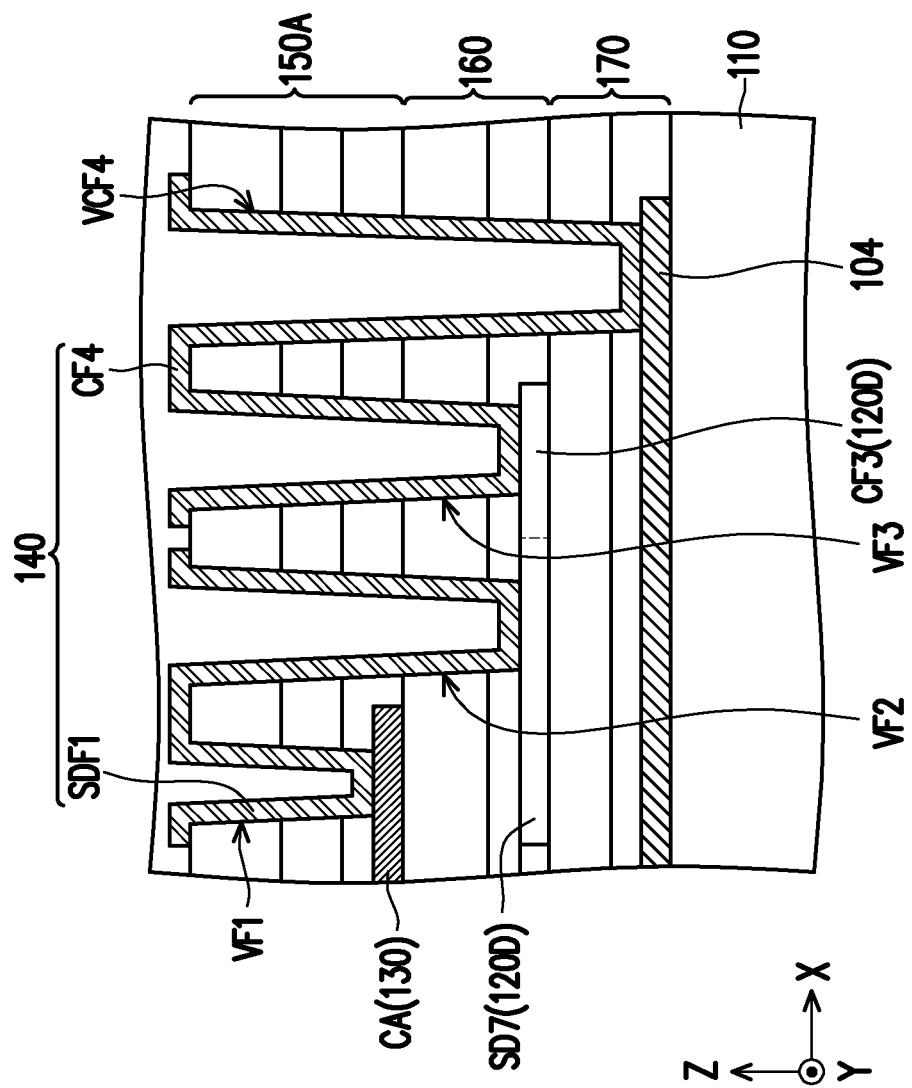
FIG. 8C is a schematic view of a connection relationship of a second conductive layer according to an embodiment of the disclosure.

FIG. 8C is a schematic view of a connection relationship of a second conductive layer according to an embodiment of the disclosure. FIG. 8C may correspond to the region EX in FIG. 5C, and is used to illustrate an embodiment of the connection relationship of the second conductive layer. Therefore, the structure of FIG. 8C may be used to replace the region EX in FIG. 5C, and for the components designated by the same reference numerals in FIGS. 8C and 5C, one may refer to the descriptions of both for more details. In FIG. 8C, a connection conductor CF3 is disposed between the second insulating layer 160 and the third insulating layer 170, and a connection conductor CF4 is disposed on the first insulating layer 150A. FIG. 8C mainly shows an embodiment in which the source-drain SDF1 configured by the second conductive layer 140 is electrically connected to the third conductive layer 104 through the connection conductor CF3 and the connection conductor CF4. When the structure of FIG. 8C is applied to the embodiment of FIG. 5C, the connection conductor CF3 is configured by the semiconductor 120D of the active element TF. The connection conductor CF4 and the source-drain SDF1 may be configured by the second conductive layer 140.

The second conductive layer 140 may be electrically connected to the capacitor electrode CA of the first conductive layer 130 and the semiconductor 120D through the first via VF1 and the second via VF2, respectively. Meanwhile, the connection conductor CF4 may be electrically connected to the connection conductor CF3 configured by the semiconductor 120D and the third conductive layer 104 through the via VCF3 and the via VCF4, respectively. The connection conductor CF3 formed by the semiconductor 120D is directly connected to the source-drain region SD7 formed by the semiconductor 120D, which means that part of the source-drain region SD7 may be used as the connection conductor CF3. Therefore, the second conductive layer 140 may be electrically connected to the semiconductor 120D and the third conductive layer 104 through the connection conductor CF4. Here, the via VCF3, for example, penetrates the first insulating layer 150A and the second insulating layer 160 and extends to the connection conductor CF3, and the via VCF4 penetrates the first insulating layer 150A, the second insulating layer 160 and the third insulating layer 170 and extends to the third conductive layer 104.

Figure 8D:
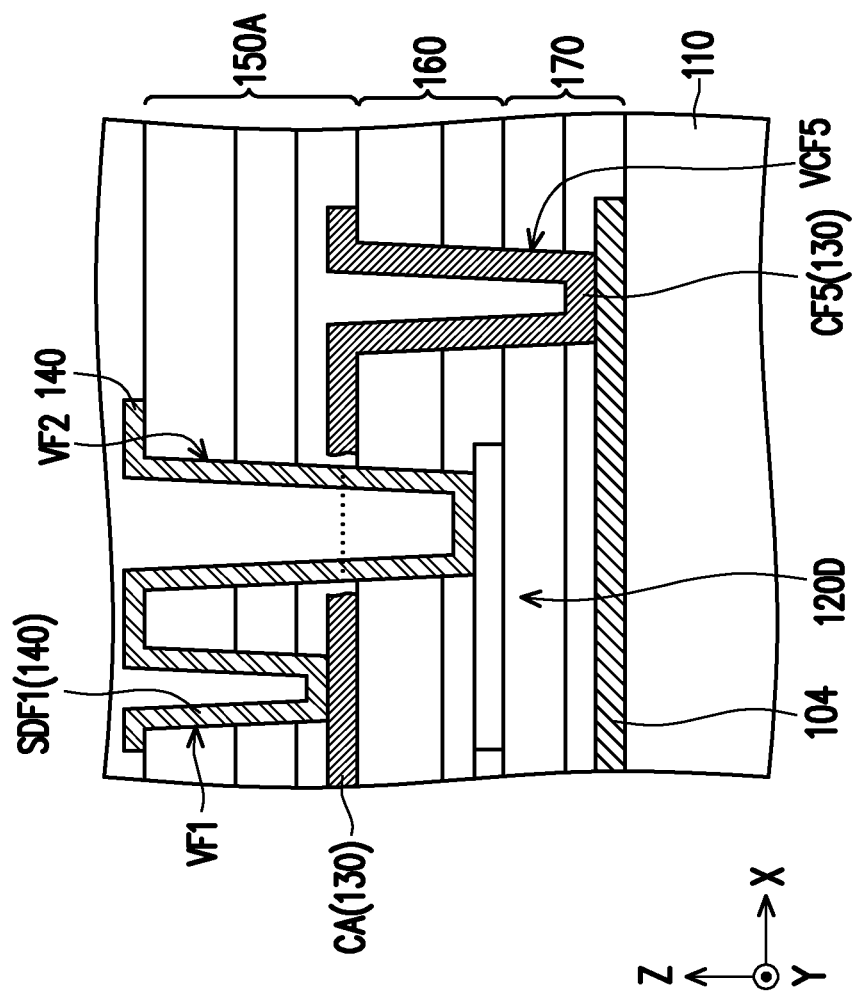
FIG. 8D is a schematic view of a connection relationship of a second conductive layer according to an embodiment of the disclosure.

FIG. 8D is a schematic view of a connection relationship of a second conductive layer 140 according to an embodiment of the disclosure. FIG. 8D may correspond to the region EX in FIG. 5C, and is used to illustrate an embodiment of the connection relationship of the second conductive layer 140. Therefore, the structure of FIG. 8D may be used to replace the region EX in FIG. 5C, and for the components designated by the same reference numerals in FIGS. 8D and 5C, one may refer to the descriptions of both for more details. In FIG. 8D, a connection conductor CF5 is disposed between the first insulating layer 150A and the second insulating layer 160. When the structure of FIG. 8D is applied to the embodiment of FIG. 5C, the connection conductor CF5 and the capacitor electrode CA are the same layer, that is, the first conductive layer 130. FIG. 8D mainly shows an embodiment in which the second conductive layer 140 is electrically connected to the third conductive layer 104 through the capacitor electrode CA and the connection conductor CF5. In this embodiment, the second conductive layer 140 is electrically connected to the capacitor electrode CA and the semiconductor 120D through the first via VF1 and the second via VF2, respectively. The connection conductor CF5 may be directly connected to the capacitor electrode CA, and the connection conductor CF5 may be electrically connected to the third conductive layer 104 through a via VCF5. The via VCF5 may penetrate the second insulating layer 160 and the third insulating layer 170 and extend to the third conductive layer 104.

Figure 8E:
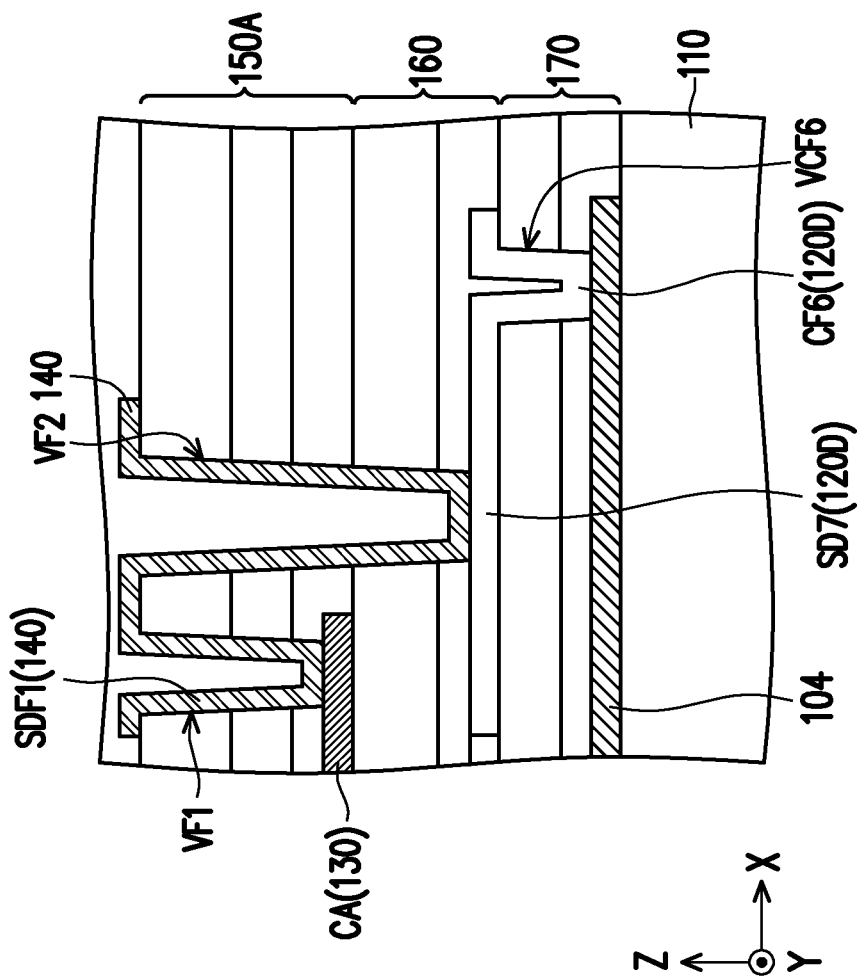
FIG. 8E is a schematic view of a connection relationship of a second conductive layer according to an embodiment of the disclosure.

FIG. 8E is a schematic view of a connection relationship of a second conductive layer 140 according to an embodiment of the disclosure. FIG. 8E may correspond to the region EX in FIG. 5C, and is used to illustrate an embodiment of the connection relationship of the second conductive layer 140. Therefore, the structure of FIG. 8E may be used to replace the region EX in FIG. 5C, and for the components designated by the same reference numerals in FIGS. 8E and 5C, one may refer to the descriptions of both for more details. In FIG. 8E, a connection conductor CF6 is disposed between the second insulating layer 160 and the third insulating layer 170. When the structure of FIG. 8E is applied to the embodiment of FIG. 5C, the connection conductor CF6 is configured by the layer of the semiconductor 120D. FIG. 8E mainly shows an embodiment in which the second conductive layer 140 is electrically connected to the third conductive layer 104 through the connection conductor CF6. In this embodiment, the second conductive layer 140 is electrically connected to the capacitor electrode CA and the semiconductor 120D through the first via VF1 and the second via VF2, respectively. The connection conductor CF6 configured by the semiconductor 120D may be directly connected to the source-drain region SD7, and the connection conductor CF6 may be electrically connected to the third conductive layer 104 through a via VCF6. The via VCF6 may penetrate the third insulating layer 170 and extend to the third conductive layer 104.

In the embodiments of FIGS. 8A to 8E, the second conductive layer 140 may be electrically connected to the first conductive layer 130, the semiconductor 120D, the conductive layer ML1 and the third conductive layer 104 through vias with different depths, respectively. These vias with different depths may have different widths. For example, a via with a deeper extending depth may have a larger width, and for the measurement method of the depth and width of the via, reference may be made to the above description. In addition, these vias with different depths may be manufactured using the same mask in the same lithography-etching step, or may be manufactured using multiple masks in different lithography-etching steps, and the disclosure is not limited to.

Figure 9A:
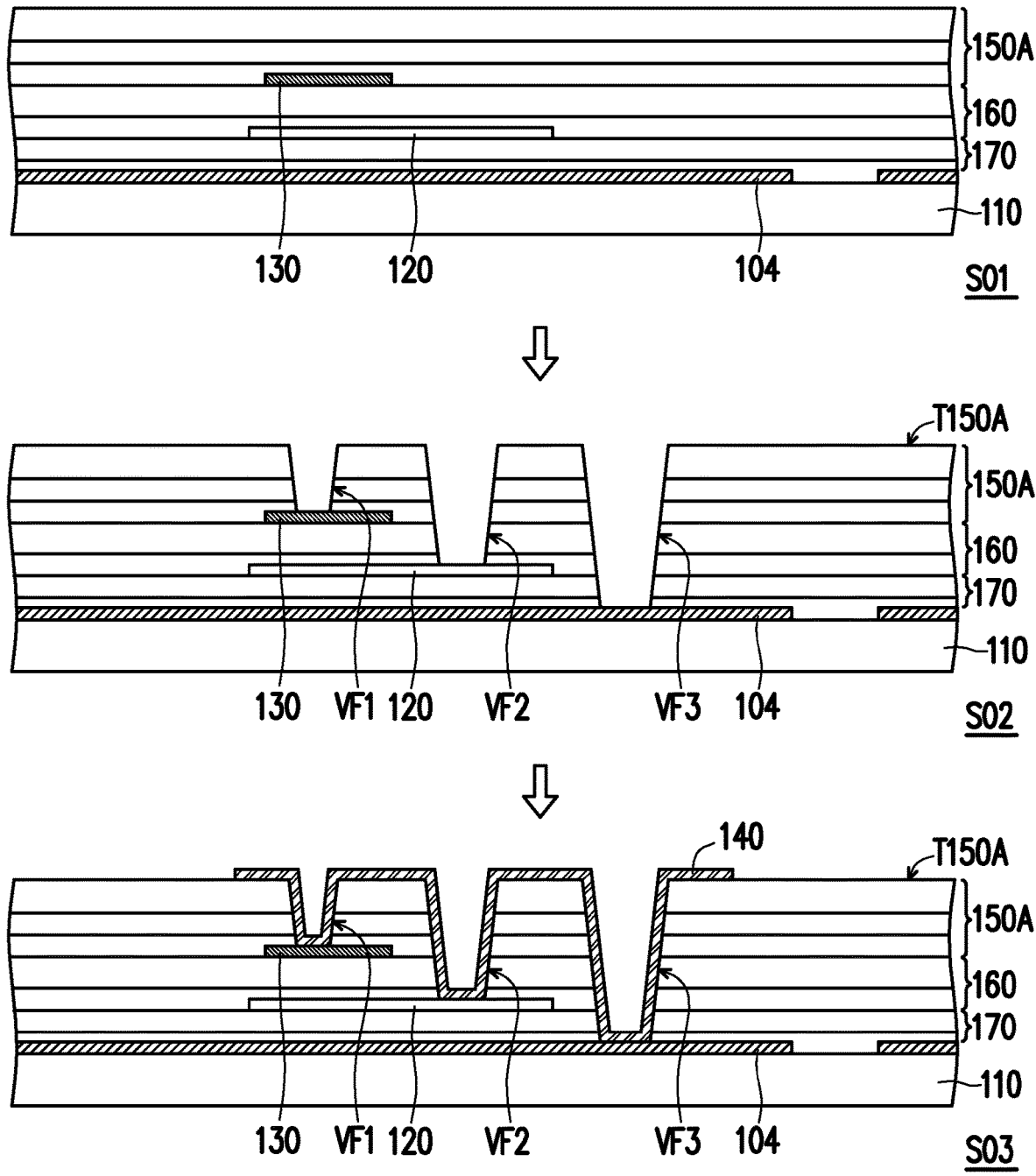
FIG. 9A is a partial manufacturing method of an electronic device according to an embodiment of the disclosure.

FIG. 9A is a partial manufacturing method of an electronic device according to an embodiment of the disclosure, and FIG. 9A shows a schematic view of a partial step of electrically connecting the third conductive layer to different layers. In FIG. 9A, step S01 indicates sequentially forming the third conductive layer 104, the third insulating layer 170, the semiconductor 120, the second insulating layer 160, the first conductive layer 130 and the first insulating layer 150A on the substrate 110. For the specific structures of the third conductive layer 104, the third insulating layer 170, the semiconductor 120, the second insulating layer 160, the first conductive layer 130 and the first insulating layer 150A, reference may be made to the components with the same reference numerals in the foregoing embodiments, and the descriptions will not be repeated. In FIG. 9A, the third conductive layer 104 is disposed between the substrate 110 and the third insulating layer 170. The third insulating layer 170 may be formed by stacking multiple layers of insulating materials (for example, the buffer layer BF1 and the buffer layer BF2 in the foregoing embodiments), but the disclosure is not limited thereto. The semiconductor 120 is disposed between the third insulating layer 170 and the second insulating layer 160. The second insulating layer 160 may include a single-layer insulating material layer or be formed by stacking multiple insulating material layers (for example, the gate insulating layer GI and the interlayer insulating layer IL in the foregoing embodiments), but the disclosure is not limited thereto. The first conductive layer 130 is disposed between the second insulating layer 160 and the first insulating layer 150A. The first insulating layer 150A may include a single-layer insulating material layer or be formed by stacking multiple insulating material layers (for example, the insulating sub-layer 152, the insulating sub-layer 154 and the insulating sub-layer 156 in the foregoing embodiments), but the disclosure is not limited thereto.

In step S02, a mask is used to perform a lithography-etching process to form the first via VF1, the second via VF2 and the third via VF3. The first via VF1, the second via VF2 and the third via VF3 may extend from the top surface T150A of the first insulating layer 150A to the first conductive layer 130, the semiconductor 120 and the third conductive layer 104, respectively, by penetrating different insulating layers. Step S02 may be understood as a via forming process. Specifically, though not shown in FIG. 9A, a patterned photoresist layer may be formed on the first insulating layer 150A, and the patterned photoresist layer may be patterned using a single mask to form photoresist patterns corresponding to the first via VF1, the second via VF2, and the third via VF3. In some embodiments, the photoresist patterns corresponding to the first via VF1, the second via VF2, and the third via VF3 may have different sizes. For example, the size of the photoresist pattern corresponding to the first via VF1 is smaller than the size of the photoresist pattern corresponding to the second via VF2, and the size of the photoresist pattern corresponding to the second via VF2 is smaller than the size of the photoresist pattern corresponding to the third via VF3. That is, when it is intended to form a via with a greater depth, a photoresist pattern with a larger size may be provided on the mask correspondingly. Then, an etching step is performed using the patterned photoresist layer as a mask to remove the insulating material corresponding to the photoresist pattern, thereby forming the first via VF1, the second via VF2 and the third via VF3. After that, the patterned photoresist layer is removed to obtain the structure of step S02.

Next, step S03 is performed to form the second conductive layer 140 on the first insulating layer 150A. The second conductive layer 140 may extend from the top surface T150A of the first insulating layer 150A to corresponding different layers along the first via VF1, the second via VF2 and the third via VF3. For example, the second conductive layer 140 may be electrically connected to the first conductive layer 130 through the first via VF1, may be electrically connected to the semiconductor 120 through the second via VF2, and may be electrically connected to the third conductive layer 104 through the third via VF3. In this way, in order to electrically connect the second conductive layer 140 to different layers, only one mask is needed to perform one etching step of insulating materials, which helps to simplify the manufacturing process of the electronic device.

Figure 9B:
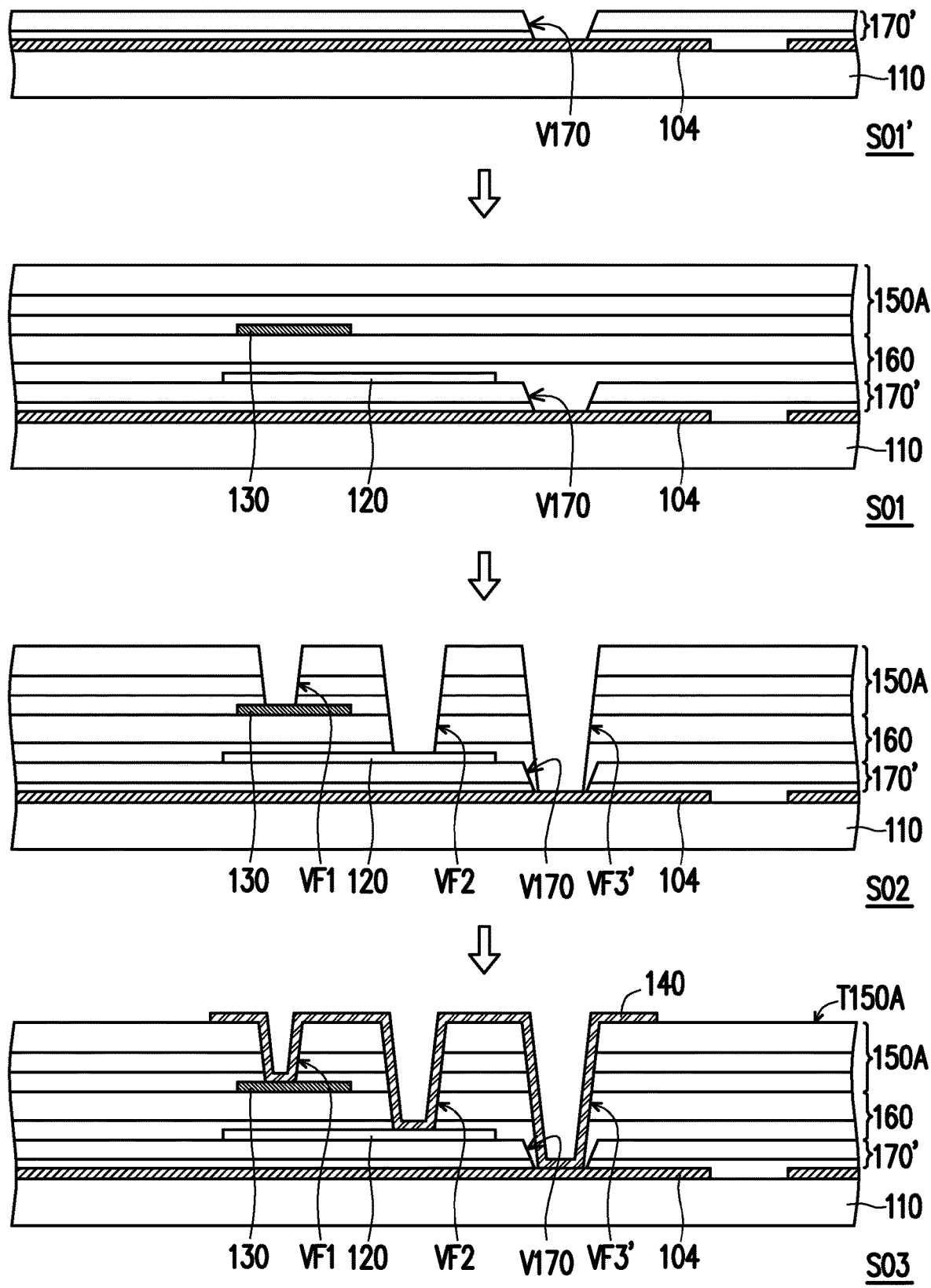
FIG. 9B is a partial manufacturing method of an electronic device according to an embodiment of the disclosure.

FIG. 9B is a partial manufacturing method of an electronic device according to an embodiment of the disclosure, and FIG. 9B shows a schematic view of a partial step of electrically connecting the third conductive layer to different layers. FIG. 9B shows substantially the same the steps as those disclosed in FIG. 9A, but the method shown in FIG. 9B further includes step S01'. Specifically, in step S01', after the third conductive layer 104 and the third insulating layer 170' are sequentially formed on the substrate 110, the third insulating layer 170' is patterned to form a via V170. The via V170 may penetrate the third insulating layer 170' and extend to the third conductive layer 104. Next, in step S01, the semiconductor 120, the second insulating layer 160, the first conductive layer 130 and the first insulating layer 150A may be sequentially formed on the third insulating layer 170'. The second insulating layer 160 may fill the via V170 to contact the third conductive layer 104. Next, in step S02, a mask is used to perform a lithography-etching process to form the first via VF1, the second via VF2 and the third via VF3'. The first via VF1 extends to the first conductive layer 130 by penetrating the first insulating layer 150A. The second via VF2 extends to the semiconductor 120 by penetrating the first insulating layer 150A and the second insulating layer 160. The third via VF3' extends to the third conductive layer 104 in the via V170 by penetrating the first insulating layer 150A and the second insulating layer 160. In this way, the second vias VF2 and the third vias VF3' penetrate the same number of insulating layers but extend to different depths. Next, step S03 is performed to form the second conductive layer 140 extending to the first via VF1, the second via VF2 and the third via VF3'. In some embodiments, the third insulating layer 170' may be covered by the second insulating layer 160 at the sidewalls of the via V170. Therefore, the second conductive layer 140 may not contact the third insulating layer 170', but the disclosure is not limited thereto. The method of FIGS. 9A and 9B may be applied to any of the foregoing embodiments for connecting one conductive layer to multiple different layers.

Figure 10A:
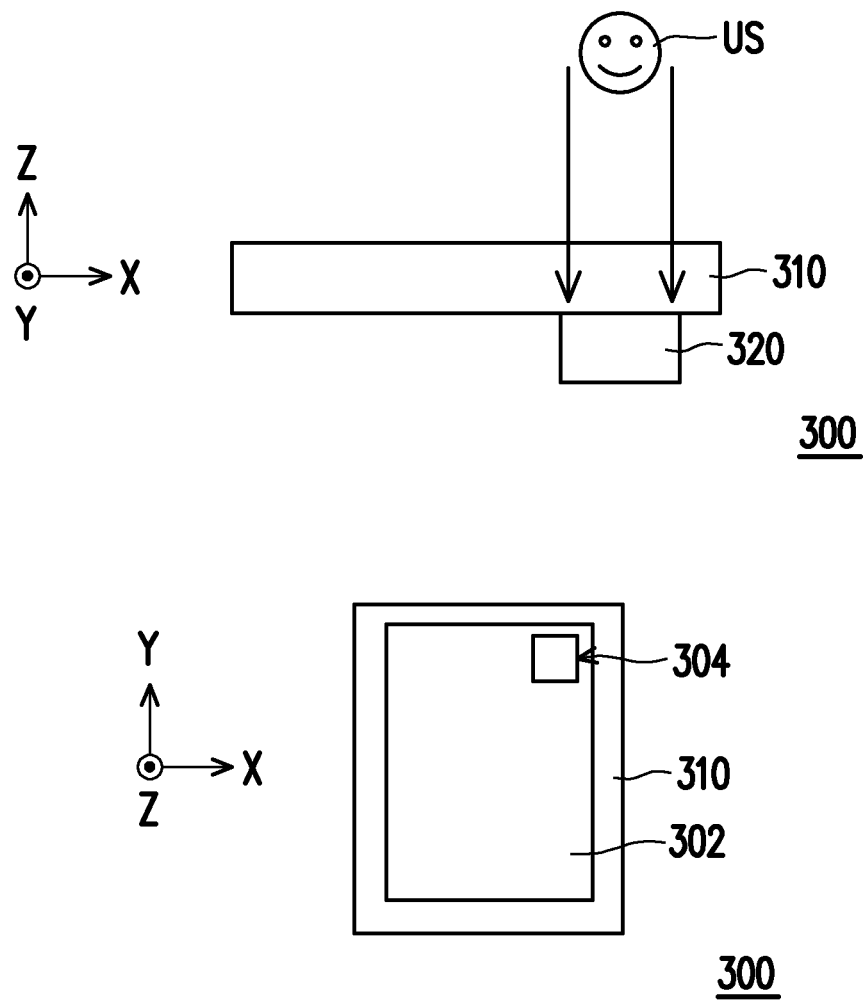
FIG. 10A is a schematic view of an electronic device according to an embodiment of the disclosure.

FIG. 10A is a schematic view of an electronic device according to an embodiment of the disclosure. FIG. 10A shows both a schematic view in the direction Y and a schematic view in the direction Z of the electronic device; for the convenience of description, FIG. 10A only shows some components of the electronic device. In FIG. 10A, the electronic device 300 may include a display device 310 and a sensor 320. The sensor 320 is located on one side of the display device 310. For example, when a user US uses the electronic device 300 to view the image displayed by the display device 310, the user US and the sensor 320 may be located on two opposite sides of the display device 310 respectively. In addition, viewed from the direction Z, the display device 310 has a display region 302 for displaying images, and the position of the sensor 320 is disposed in a penetration region 304 in the display region 302. The penetration region 304 allows light to pass through the display device 310 while allowing the sensor 320 on one side of the display device 310 to receive the light. In some embodiments, the penetration region 304 may be located in the display region 302, so the display panel 310 may also display image information in the penetration region 304.

Figure 10B:
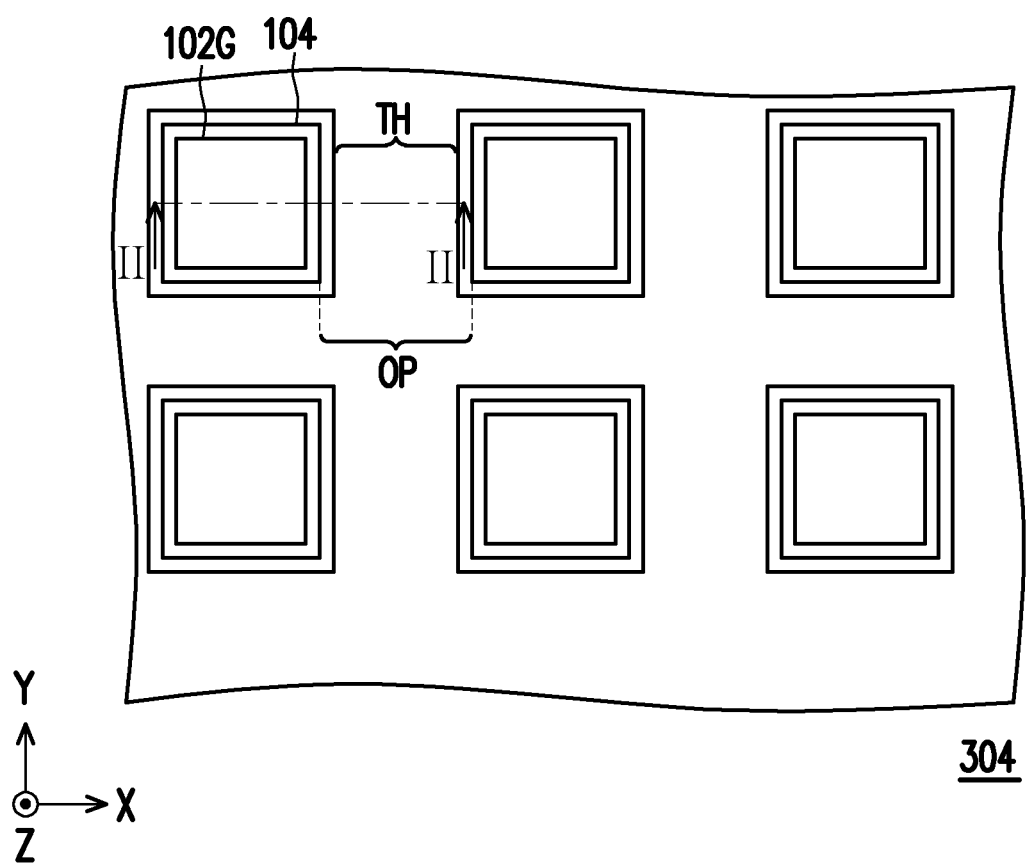
FIG. 10B is a partially enlarged schematic view of the penetration region of FIG. 10A.
Figure 10C:
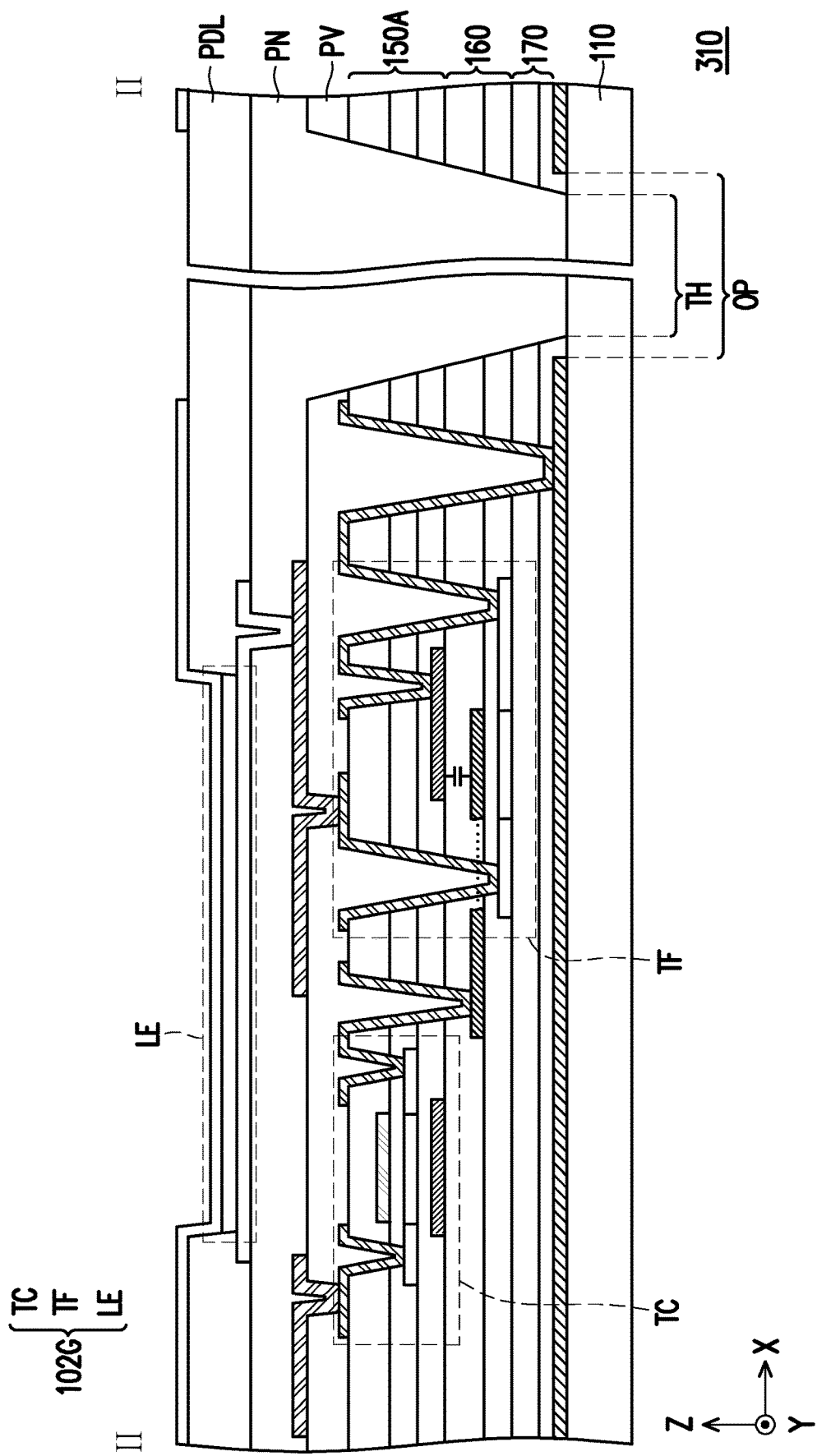
FIG. 10C is a schematic view of a cross section taken along the line II-II in FIG. 10B in some embodiments.

FIG. 10B is a partially enlarged schematic view of the penetration region of FIG. 10A, and FIG. 10C is a schematic view of a cross section taken along the line II-II in FIG. 10B in some embodiments. With reference to FIGS. 10B and 10C, the display panel 310 includes, in the penetration region 304, the pixel circuit 102G, the third conductive layer 104, and the first insulating layer 150A, the second insulating layer 160, the third insulating layer 170, the passivation layer PV, the planarization layer PN, the pixel definition layer PDL, and the like for separating different conductive layers. For the pixel circuit 102G, the first insulating layer 150A, the second insulating layer 160, the third insulating layer 170, the passivation layer PV, the planarization layer PN, and the pixel definition layer PDL, reference may be made to the description of FIG. 5C and related embodiments. In some embodiments, the pixel circuit 102G may be replaced by any one of the pixel circuit 102E, the pixel circuit 102F and any alternative pixel circuit in the foregoing embodiments, and the specific structure of the pixel circuit 102G is not limited.

With reference to FIGS. 10B and 10C, the third conductive layer 104 is disposed between the substrate 110 and the pixel circuit 102G, and has the opening OP. The opening OP may allow light to pass through and define an actual light-transmitting region in the penetration region 304. In this embodiment, the display panel 310 may have a light-transmitting via TH, which penetrates the first insulating layer 150A, the second insulating layer 160, the third insulating layer 170 and the passivation layer PV. The light-transmitting via TH is located in the opening OP and at least partially overlaps the opening OP. The planarization layer PN may fill the light-transmitting via TH to provide a planarization effect. In this way, in the region of the opening OP, there is a stack structure with fewer insulating layers; therefore, the ratio of light passing through the opening OP may be increased, and the light transmittance of the penetration region 304 may be improved. Therefore, the electronic device 300 may allow more light to pass through the penetration region 304 and be received by the sensor 320, thereby improving the light acquisition effect of the sensor 320. For example, when the sensor 320 serves as a camera, the design of the light-transmitting via TH helps improving the light reception amount of the camera and achieving good image acquisition performance.

To sum up, the electronic device of the embodiments of the disclosure may use the same masking process to allow a single conductive layer to be electrically connected to other components of different layers. For example, a single conductive layer may be connected to different layers through multiple vias with different depths. These vias with different depths are formed to have different widths, and vias with deeper depths may have larger widths. In this way, the vias with different depths may not only be manufactured at the same time, but also have suitable sizes.

In the end, it should be noted that the above embodiments are only used to describe the technical solutions of the disclosure rather than to limit the disclosure. Although the disclosure has been described in detail with reference to the foregoing embodiments, those skilled in the art should understand that modifications to the technical solutions described in the foregoing embodiments may be made, or some or all of the technical features therein may be replaced with equivalents; however, such modifications or replacements do not cause the spirit of the corresponding technical solutions to depart from the scope of the technical solutions of the embodiments of the disclosure.

What is claimed is:

1. An electronic device, comprising:
 a substrate;
 a semiconductor disposed on the substrate;
 a first conductive layer disposed on the semiconductor;
 a second conductive layer disposed on the first conductive layer;
 a first insulating layer disposed between the first conductive layer and the second conductive layer; and
 a second insulating layer disposed between the first conductive layer and the semiconductor,
 wherein the second conductive layer is electrically connected to the first conductive layer through a first via penetrating the first insulating layer and electrically connected to the semiconductor through a second via penetrating the first insulating layer and the second insulating layer, and a width of the first via is less than a width of the second via.

2. The electronic device as claimed in claim 1, further comprising:
 a third conductive layer disposed between the substrate and the semiconductor; and
 a third insulating layer disposed between the semiconductor and the third conductive layer,
 wherein the second conductive layer is electrically connected to the third conductive layer through a third via penetrating the first insulating layer, the second insulating layer and the third insulating layer, and a width of the third via is greater than the width of the second via.

3. The electronic device as claimed in claim 2, wherein the third conductive layer has an opening through which a light is allowed to pass.

4. The electronic device as claimed in claim 3, further comprising a sensor disposed under the substrate, wherein the sensor is overlapped with the opening.

5. The electronic device as claimed in claim 1, wherein the second conductive layer is configured to receive a power signal.

6. The electronic device as claimed in claim 1, wherein the semiconductor comprises silicon.

7. The electronic device as claimed in claim 1, wherein the semiconductor comprises metal oxide.

8. The electronic device as claimed in claim 1, wherein the width of the first via satisfies the following equation:

$$0.82*X+1.63 \text{ μm} \leq Y \leq 0.82*X+2.43 \text{ μm},$$

wherein Y is the width of the first via in μm, X is a depth of the first via in μm, and X is greater than or equal to 0 μm and less than or equal to 3 μm.

9. The electronic device as claimed in claim 8, wherein the width of the first via further satisfies the following equation:

$$0.82*X+1.83 \text{ μm} \leq Y \leq 0.82*X+2.23 \text{ μm}.$$

10. An electronic device, comprising:
 a substrate;
 a first conductive layer disposed on the substrate;
 a second conductive layer disposed on the first conductive layer; and
 an insulating layer disposed between the first conductive layer and the second conductive layer and having a via, wherein the second conductive layer is electrically connected to the first conductive layer through the via, and a width of the via satisfies the following equation:

$$0.82*X+1.63 \text{ μm} \leq Y \leq 0.82*X+2.43 \text{ μm},$$

wherein Y is the width of the via in μm, X is a depth of the via in μm, and X is greater than or equal to 0 μm and less than or equal to 3 μm.

11. The electronic device as claimed in claim 10, wherein the width of the via further satisfies the following equation:

$$0.82*X+1.83 \text{ μm} \leq Y \leq 0.82*X+2.23 \text{ μm}.$$

* * * * *